United States Patent
Namba et al.

(10) Patent No.: US 6,969,945 B2
(45) Date of Patent: Nov. 29, 2005

(54) SURFACE ACOUSTIC WAVE DEVICE, METHOD FOR MANUFACTURING, AND ELECTRONIC CIRCUIT DEVICE

(75) Inventors: Akihiko Namba, Osaka (JP); Keiji Onishi, Osaka (JP); Yasuhiro Sugaya, Osaka (JP); Katsunori Moritoki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/399,305

(22) PCT Filed: Feb. 6, 2002

(86) PCT No.: PCT/JP02/00949

§ 371 (c)(1),
(2), (4) Date: Aug. 15, 2003

(87) PCT Pub. No.: WO02/063763

PCT Pub. Date: Aug. 15, 2002

(65) Prior Publication Data

US 2004/0026361 A1    Feb. 12, 2004

(30) Foreign Application Priority Data

Feb. 6, 2001    (JP)    ............... 2001-29079
Mar. 22, 2001   (JP)    ............... 2001-82149
May 17, 2001    (JP)    ............... 2001-147377

(51) Int. Cl.[7] ......................................... H01L 41/08

(52) U.S. Cl. ................ 310/340; 310/313 R; 310/344

(58) Field of Search ................ 310/313 R, 340, 310/344, 348

(56) References Cited

U.S. PATENT DOCUMENTS

| | | | | |
|---|---|---|---|---|
| 5,459,368 A | * | 10/1995 | Onishi et al. | ............ 310/313 R |
| 5,821,665 A | * | 10/1998 | Onishi et al. | ............ 310/313 R |
| 6,078,123 A | * | 6/2000 | Tanaka et al. | ............ 310/313 R |
| 6,262,513 B1 | * | 7/2001 | Furukawa et al. | ............ 310/313 R |
| 6,310,421 B2 | * | 10/2001 | Morishima | ............ 310/313 R |

FOREIGN PATENT DOCUMENTS

| JP | 4-56510 | 2/1992 |
|---|---|---|
| JP | 10-270975 | 10/1998 |

(Continued)

OTHER PUBLICATIONS

International Search Report corresponding to application No. PCT/JP02/00949 dated Apr. 2, 2002.

(Continued)

Primary Examiner—Mark Budd
(74) Attorney, Agent, or Firm—RatnerPrestia

(57) ABSTRACT

A surface acoustic wave device which occupies a small mounting area and has a low profile, yet having an improved reliability, and can be made available at low cost. The surface acoustic wave device comprises a piezoelectric substrate, a function region formed of comb-like electrodes for exciting surface acoustic wave provided on a main surface of the piezoelectric substrate, a space formation member covering the function region, a plurality of bump electrodes provided on a main surface of the piezoelectric substrate and a terminal electrode provided opposed to the main surface of piezoelectric substrate. The bump electrode and the terminal electrode are having a direct electrical connection, and a space between piezoelectric substrate and terminal electrode is filled with resin. When the above-configured acoustic wave device is applied for a frequency filter, a resonator, in a portable telephone unit, a keyless entry or the like communication apparatus, the overall size of such apparatus can be reduced and a higher reliability is implemented.

23 Claims, 19 Drawing Sheets

FOREIGN PATENT DOCUMENTS

| | | |
|---|---|---|
| JP | 11-251866 | 9/1999 |
| JP | 2000-261284 | 9/2000 |
| JP | 2000-323603 | 11/2000 |

OTHER PUBLICATIONS

English translation of Form PCT/ISA/210.

* cited by examiner

SURFACE ACOUSTIC WAVE DEVICE, METHOD FOR MANUFACTURING, AND ELECTRONIC CIRCUIT DEVICE

This application is a U.S. National Phase Application of PCT International Application PCT/JP02/00949.

TECHNICAL FIELD

The present invention relates to a surface acoustic wave device used as frequency filter or resonator in a portable telephone unit, a keyless entry and the like communication devices. It also relates to a high frequency module containing the surface acoustic wave device.

BACKGROUND ART

Portable telephone units and the like portable information terminal apparatus are making remarkable evolution towards the compactness in size, lightness in weight and slimness in overall contour. So, for the semiconductor devices and other electronic components such as filter, resonator, etc., it is an essential requirement to be consistent with the above trends if they are to be adopted in such recent apparatus.

An example of such components is disclosed in Japanese Patent Laid-Open Application No. H10-270975; a surface acoustic wave device, in which the surface acoustic wave element is covered with an empty cover in the function region formed of comb-like electrodes, and is connected to a terminal electrode provided on the surface of wiring board by means of bump, and a space between the surface acoustic wave element and the wiring board is filled with resin. Also, Japanese Patent Laid-Open Application No. 2000-323603 proposes a semiconductor device in which a terminal electrode is connected direct, eliminating a wiring board, with a bump formed on electrode pad of semiconductor device, and it is sealed with resin excluding the bottom surface of terminal electrode.

In the following, some of the conventional surface acoustic wave devices and the manufacturing method are described referring to the drawings.

FIG. 16(a) is a cross sectional view showing a first example of conventional surface acoustic wave device. As shown in FIG. 16(a), a piezoelectric substrate 41 is provided on the surface with a function region 42 formed of comb-like electrodes for exciting surface acoustic wave, and an electrode pad 43 for conveying electric signal to the function region 42. Each of the electrode pads 43 is connected with corresponding terminal 44 of a package 46 via a thin metal wire 45. The thin metal wire 45 is normally made of gold, aluminum, etc. Package 46 in the present example is formed of laminated alumina ceramics 46a, 46b, 46c, and terminal 44 is electrically connected with terminal electrode 48 via an inner electrode 47. Although not illustrated in the drawing, piezoelectric substrate 41 is glued to the inside of package 46 with a resin adhesive. Package 46 is hermetically sealed with a lid 49 made of ceramic, metal, etc.

In the above-described first conventional example as shown in FIG. 16(a), however, a sufficiently large space needs to be secured in both the horizontal and vertical directions for the operation of bonding the thin metal wires 45, and respective electrode pads 43 as well as terminals 44 are requested to have a certain area that is large enough for the bonding operation. These have been material factors that hindered the device downsizing. Furthermore, a parasitic inductance intrinsic to thin metal wire 45 may deteriorate the high frequency characteristic of the element. While on the production floor, thin metal wire 45 has to be bonded one by one to connect corresponding electrode pads 43 and terminals 44. This has blocked the cost cutting efforts substantially.

Addressing the above problems, a second example is proposed for a conventional surface acoustic wave device that enables further downsizing, as shown in FIG. 16(b). In the proposed structure, a surface acoustic wave element 50 which is structured of a piezoelectric substrate 41, a function region 42 formed of comb-like electrodes, a bump electrode 53 provided on electrode pad 52, etc. is mounted with the face down. The function region 42 is covered with a space formation member 51 formed of a surrounding wall and a lid, so that a space for vibration is secured. A wiring board 54 is provided with a terminal 55 on the surface, the surface acoustic wave element 50 is connected with terminal 55 via bump electrode 53. Terminal 55 and terminal electrode 56 provided respectively on the upper surface and the bottom surface of wiring board 54 are connected via an inner electrodes 57 which is penetrating through the wiring board 54. A space between the surface acoustic wave element 50 and the wiring board 54 is filled with a resin 58 in order to enhance fixing between the two.

In the structure of FIG. 16(b), however, contact location of bump electrode 53 and location of inner electrode 57 have to be shifted sidewise to each other, since terminal 55 and terminal electrode 56 disposed respectively on the upper surface and the bottom surface of wiring board 54 are connected by inner electrode 57. Namely, because of difference in the curing/shrinking behavior between the base material of wiring board 54 and the electrode paste of inner electrode 57, the inner electrode 57 might protrude or sink in the thickness direction from the wiring board 54 during manufacturing.

In order to solve the above problem, a third example is proposed to a conventional structure, which enables to shrink the sidewise length too, as shown in FIG. 17(a).

Wiring board 54 is provided with a terminal electrode 56 which is stretching from the upper surface to the bottom surface covering the side face. Bump electrode 53 of surface acoustic wave element 50 is connected to the terminal electrode 56. Surface acoustic wave element 50 is provided with a space formation member 51 which secures a vibration space for function region 42, where surface acoustic wave excited on the main surface of piezoelectric substrate 41 propagates. Space between the surface acoustic wave element 50 and the wiring board 54 is sealed with a resin 58.

The above-configured surface acoustic wave device is manufactured through the following process steps. In the first place, a surface acoustic wave element 50 comprising a space formation member 51 covering function region 42 and a bump electrode 53, and a wiring board 54 comprising a terminal electrode 56 are prepared. These are coupled together with bump electrode 53 aligned on terminal electrode 56 and connected to. Space between surface acoustic wave element 50 and wiring board 54 is filled with a resin 58 for gluing the two together. Resin 58 enhances the gluing strength and the reliability.

In the third example of conventional surface acoustic wave device as shown in FIG. 17(a), the main surface of surface acoustic wave element 50 is sealed with resin 58, and size of the wiring board 54 can be reduced to approximately the same as that of surface acoustic wave element 50. However, reduction in the thickness is limited by the existence of a wiring board 54.

The downsizing and thickness-cutting race is proceeding rapidly also among the semiconductor devices. For this purpose, a structure as illustrated in FIG. 17(b) is proposed. A semiconductor chip 59 is provided with a bump electrode 61 formed on an electrode pad (not shown). A terminal electrode 62 is connected with the bump electrode 61. A first resin 63 is applied in a space between terminal electrode 62 and semiconductor substrate 60 with the bottom surface of terminal electrode 62 exposed. The back surface of semiconductor substrate 60 is covered with a second resin 64 for enhancing the strength and the reliability.

Process of manufacturing the above-configured semiconductor device is shown with cross sectional views in FIG. 18(a) through (e).

In the first place, a carrier 65 which is made of resin base film provided with a terminal electrode 62 formed thereon, and a semiconductor chip 59 provided with a bump electrode 61 formed on electrode pad (not shown) of semiconductor substrate 60 are prepared as shown in FIG. 18(a). Then, these two are coupled together, as illustrated in FIG. 18(b), with the bump electrode 61 aligned on the terminal electrode 62 and connected by an ultrasonic thermal compression process.

As shown in FIG. 18(c), a first resin 63 is applied surrounding the semiconductor chip 59 and the bump electrode 61, and cured to provide an under-fill. Then, as shown in FIG. 18(d), the carrier 65 is clamped from the up and down with an upper mold 66 and a lower mold 67, and a resin filling space 68 is filled with a second resin 64 to form a sealing body. And then, it is taken out of the molds, and the carrier 65 is removed. Thus, a semiconductor device protected in a chip-sized package is provided as shown in FIG. 18(e); where it is protected by a sealing body formed of first resin 63 and second resin 64, and terminal electrode 62 is exposed in the bottom surface of the sealing body.

The above-configured structure and method of manufacturing seems to be applicable also to manufacturing of a surface acoustic wave device. However, there are still a number of problems left to be solved before it is actually applied to the surface acoustic wave device.

For example, when a surface acoustic wave device is fabricated in the same configuration as the above-described semiconductor device, the overall thickness may be reduced by a thickness corresponding to the eliminated wiring substrate. But the outer edge of terminal electrode 62 is disposed recessed from the side surface of thick sealing body of resin. So, when mounting a surface acoustic wave device of the above configuration on a circuit board using a solder, a smooth solder flow is blocked by the very narrow gap between the bottom surface of sealing body and the wiring board. As a result, accuracy in the height above wiring board and the positioning accuracy of surface acoustic wave devices may be dispersed by a dispersion in shape and area among individual lands formed on a wiring board and in quantity of dispensed solder. Furthermore, due to the same reason as described above, bubbles in the molten solder are difficult to disappear during soldering on a wiring board. This may cause voids in the solder.

Application of the above method for manufacturing semiconductor devices as illustrated in FIG. 18(a) through FIG. 18(b) to the manufacture of surface acoustic wave devices further encounters following difficulty. Namely, since a resin base film is used for the carrier and each of the terminal electrodes is electrically independent, a surface acoustic wave element might suffer from pyroelectric damage caused by heat applied during the production process, from the connection of bump electrode to terminal electrode up to the step of sealing.

DISCLOSURE OF INVENTION

The present invention addresses the above problems and aims to offer a structure that can implement a small-area and low-profile surface acoustic wave device, which device also implementing a reduced cost and a higher reliability. A method for manufacturing such devices is also disclosed. The present invention further offers an electronic circuit device incorporating such a surface acoustic wave device.

A first surface acoustic wave device in the present invention comprises a piezoelectric substrate, comb-like electrodes provided on a main surface of the piezoelectric substrate for exciting surface acoustic wave, a space formation member provided to cover the comb-like electrode portion, a plurality of bump electrodes provided on the main surface of piezoelectric substrate, and a terminal electrode provided opposed to the main surface of piezoelectric substrate. The bump electrode is electrically connected direct to a main face of the terminal electrode, and at least a space between the piezoelectric substrate and the terminal electrode is filled with a resin.

A second surface acoustic wave device in the present invention is the above first surface acoustic wave device further comprising a conductor island which is disposed opposed to the space formation member.

A first method for manufacturing the surface acoustic wave device in accordance with the present invention comprises the steps of disposing the main surface of a surface acoustic wave element having a plurality of comb-like electrodes for exciting surface acoustic wave, a space forming member for covering the comb-like electrode portion and a bump electrode provided thereon to be opposing to the main surface of a carrier having a terminal electrode formed thereon, and electrically connecting the bump electrode and the terminal electrode; filling a space between the surface acoustic wave element and the carrier with a liquid state resin; and removing the carrier after the resin was cured.

A second method for manufacturing the surface acoustic wave device in accordance with the present invention comprises the steps of preparing a carrier having a separation layer and a metal layer formed in the order on the main surface, and selectively etching the metal layer to form a terminal electrode; connecting a bump electrode of surface acoustic wave element with a terminal electrode; sealing with resin to cover the surface acoustic wave element; peeling the carrier off; and cutting the resin and the terminal electrode to provide individual surface acoustic wave devices.

A third method for manufacturing the surface acoustic wave device in accordance with the present invention comprises the steps of forming a plurality of surface acoustic wave elements on a wafer made of a piezoelectric material; pressing the wafer onto the carrier; filling a space between the wafer and the carrier with a sealing resin; removing the carrier after the sealing resin was cured; forming a terminal electrode so that part of it covers the bump electrode; and cutting the wafer and the sealing resin to provide individual surface acoustic wave devices.

An electronic circuit device in accordance with the present invention comprises a surface acoustic wave device which comprises comb-like electrodes for exciting surface acoustic wave, an wall formed surrounding the comb-like electrodes, a bump electrode and a terminal electrode connected with the bump electrode, and is resin-sealed exposing the function region surrounded by the wall, which device is mounted on a wiring board having a land formed thereon and the terminal electrode of the surface acoustic wave device is connected to the land of the wiring board.

BEST MODE FOR CARRYING OUT THE INVENTION

Figure 1A:
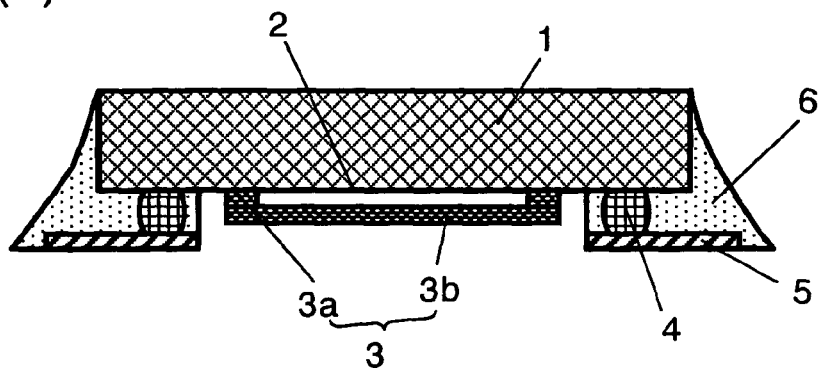
FIG. 1(a) is a cross sectional view used to describe a first example of surface acoustic wave device in accordance with a first exemplary embodiment of the present invention.

Exemplary embodiments of the present invention are described in the following referring to the drawings.

(Embodiment 1)

A first example of surface acoustic wave device in accordance with a first exemplary embodiment of the present invention is described with reference to the drawings.

Figure 1B:
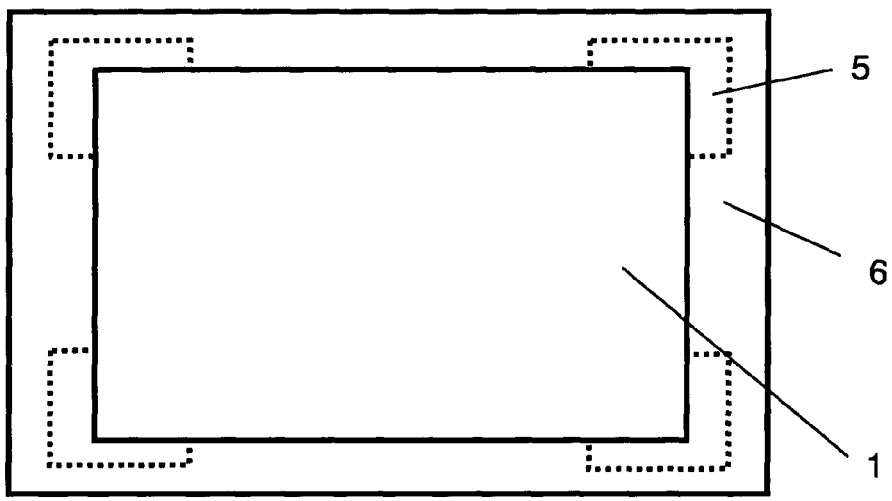
FIG. 1(b) is the plan view.
Figure 1C:
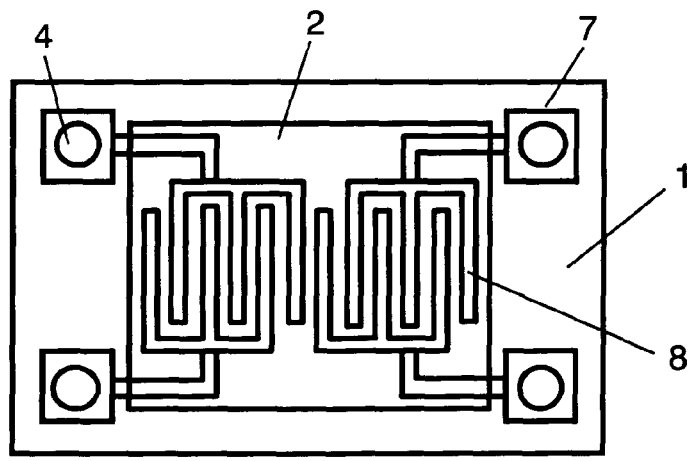
FIG. 1(c) is the plan view showing the surface acoustic wave element.

FIG. 1(a) is a cross sectional view used to describe a first example of surface acoustic wave device in accordance with a first exemplary embodiment of the present invention, FIG. 1(b) shows the device as viewed from the above, FIG. 1(c) is a drawing used to describe the surface acoustic wave element.

Figure 19A:
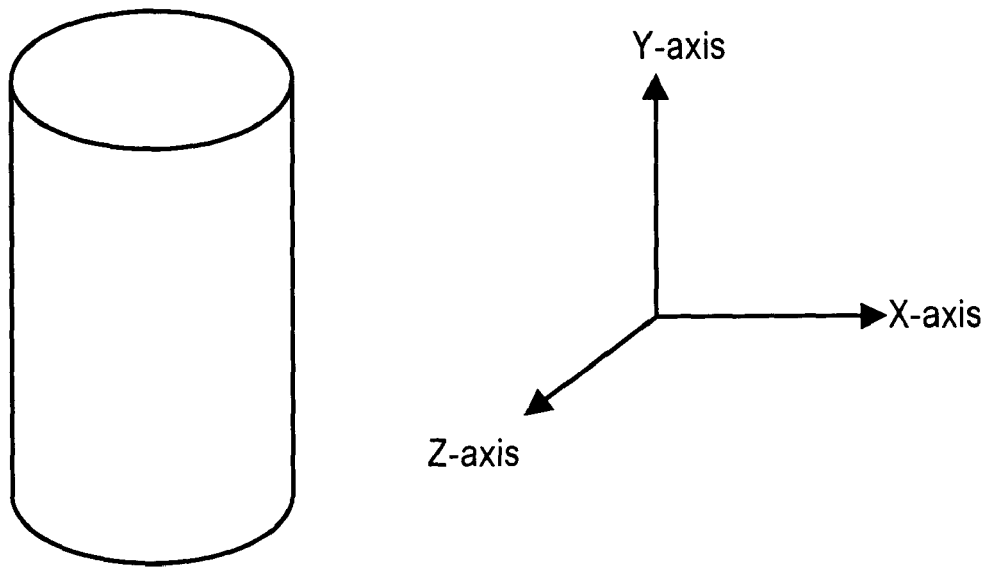
FIG. 19(a), (b) are drawings used to describe the angle of sawing a single crystalline piezoelectric wafer.
Figure 19B:
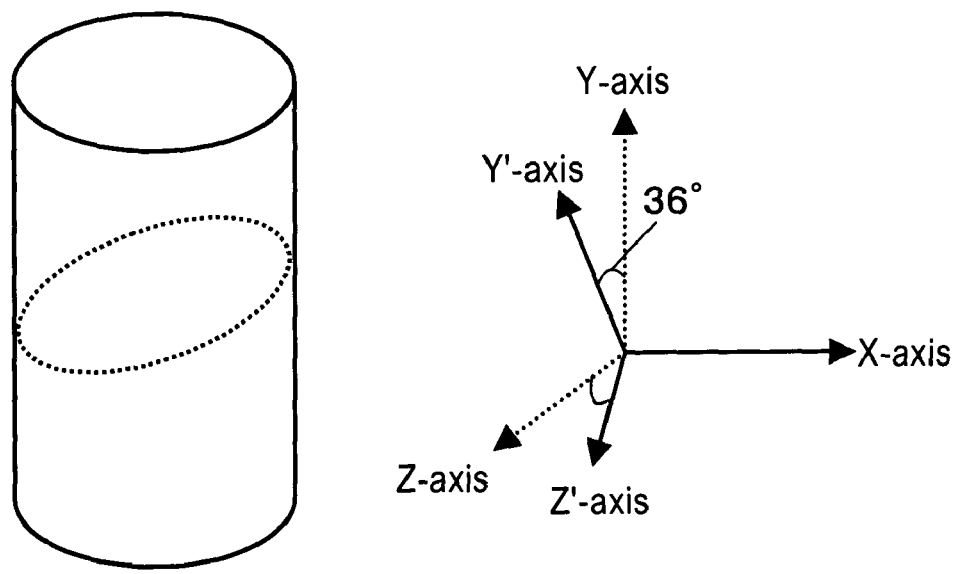

Size of a piezoelectric substrate 1 is 1.5×1.0 mm, and 0.3 mm thick. The terminology size used here means two-dimensional area of a device, and the same applies also to the other embodiments and examples. As to the material of the piezoelectric substrate 1, a single crystalline piezoelectric material such as lithium tantalate, lithium niobate, quartz, potassium niobate, langasite, etc. is used. Or a certain specific substrate provided with film of zinc oxide, aluminum nitride, etc. formed thereon may be used. In the present embodiment, a lithium tantalate sawn at Y 36° is used. The sawing angle is described referring to FIG. 19. FIG. 19(a) shows a state of single crystalline piezoelectric material before sawing, illustrated in terms of the x, y and z axes. The single crystalline piezoelectric material is spontaneously polarized in the c axis direction, or z axis. A lithium tantalate of y 36°, for example, is provided through a processing as illustrated in FIG. 19(b); revolving the y axis by 36° around the x axis making it a new y' axis, the z axis is also revolved by 36° making it a new z' axis, and it is sawn being regulated by the y' axis. A sawing angle may be selected according to an intended device characteristic; for most of the high frequency filters, a lithium tantalate substrate sawn at the neighborhood of y 36° is used.

On the piezoelectric substrate 1, a comb-like electrodes 8 are provided for exciting surface acoustic wave. Although a comb-like electrode illustrated in FIG. 1(c) has only three teeth, there are more than several tens of teeth in an actual electrode and the teeth of other electrode are disposed alternately. Although only two couples of comb-like filters are shown in FIG. 1(c), actual surface acoustic wave element normally has several couples for forming a filter device, etc. An electrode pad 7 (not shown in FIG. 1(a), a cross sectional view) formed on piezoelectric substrate 1 is provided with a bump electrode 4. The bump electrode 4 can be made of any one of conductive materials; gold, solder, copper, tin, lead, silver, etc. are often selected. Normally, a metal containing at least one content among the above group is used.

Referring to FIG. 1(a), a function region 2 of surface acoustic wave element represents an area in which the surface acoustic wave disperses, or an area where the comb-like filters are disposed. In order to protect the function region 2, a space formation member 3 formed of an wall 3a and a lid 3b is provided by means of dry film resist, etc. Space between piezoelectric substrate 1 and terminal electrode 5 is 60 μm in the present embodiment.

Terminal electrode 5 is electrically connected with bump electrode 4 to function as the electrode for taking in and out electric signals. A resin 6 is provided to fill the space between piezoelectric substrate 1 and terminal electrode 5. As illustrated in FIG. 1(b), the resin 6 is disposed around the circumference of piezoelectric substrate 1.

The above-configured first example of surface acoustic wave device in embodiment 1 has the following advantages.

Because a wiring board has been eliminated, device height can be further reduced from that of the conventional devices. Since bump electrode 4 and terminal electrode 5 are connected direct on a straight line, element size can be made more compact and lower in the height. Since resin 6 is thin and less in volume, warping of surface acoustic wave device due to the shrinkage during curing and the thermal stress after curing, which being a task to be solved with conventional devices, can be reduced significantly. As a result, it can be mounted on other circuit board (secondary mounting) easily by means of reflow soldering, etc., and the reliability improves.

By the same reasons, residual stress at joint portion between electrode pad 7 and bump electrode 4, and that between bump electrode 4 and terminal electrode 5 can be reduced. This improves the withstanding capability in thermal shock test, drop test, etc. Thus the reliability after secondary mounting significantly improves.

Figure 2A:
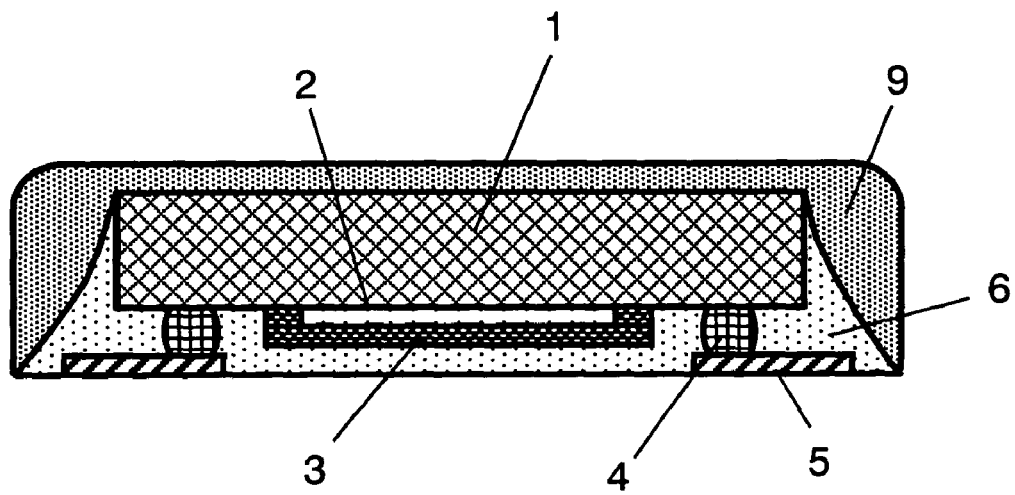
FIG. 2(a), (b) are cross sectional views used to describe examples of the sealing with resin in a surface acoustic wave device in the first embodiment.
Figure 2B:
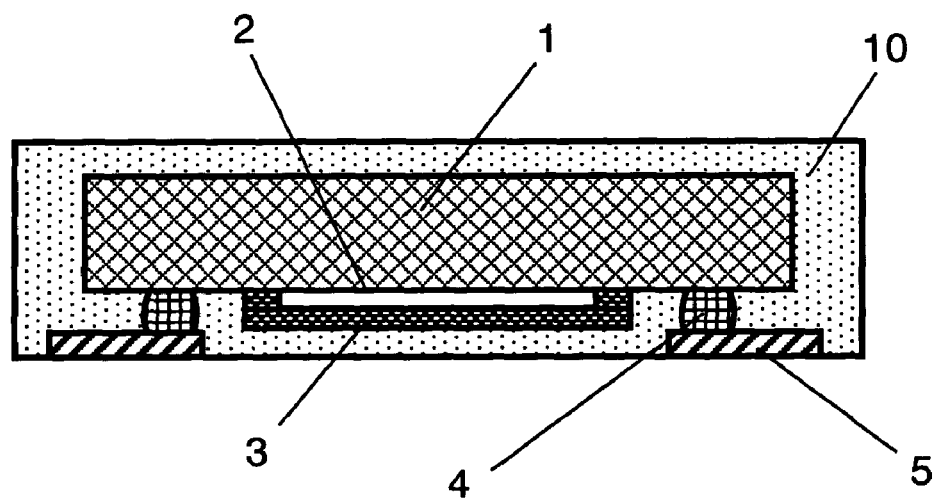

As to the sealing with resin, one possible structure is shown in FIG. 2(a); where a space between piezoelectric substrate 1 and terminal electrode 5 is sealed with a resin 6, and then the sides and the back surface of piezoelectric substrate 1 are covered with a second resin 9. Another possibility is shown in FIG. 2(b); where it is entirely covered with a sealing resin 10, with the terminal electrode 5 exposed from the bottom surface of the sealing resin. The resin-sealed structure alleviates a drop-shock, and because of an increased overall thermal capacitance it prevents a pyroelectric damage due to wild temperature shift. Furthermore, the resin material covering entire piezoelectric substrate 1 alleviates warping of a surface acoustic wave device. This contributes to lower the reject at secondary mounting.

Next, a second example of surface acoustic wave device in embodiment 1 is described referring to the drawings.

Figure 3A:
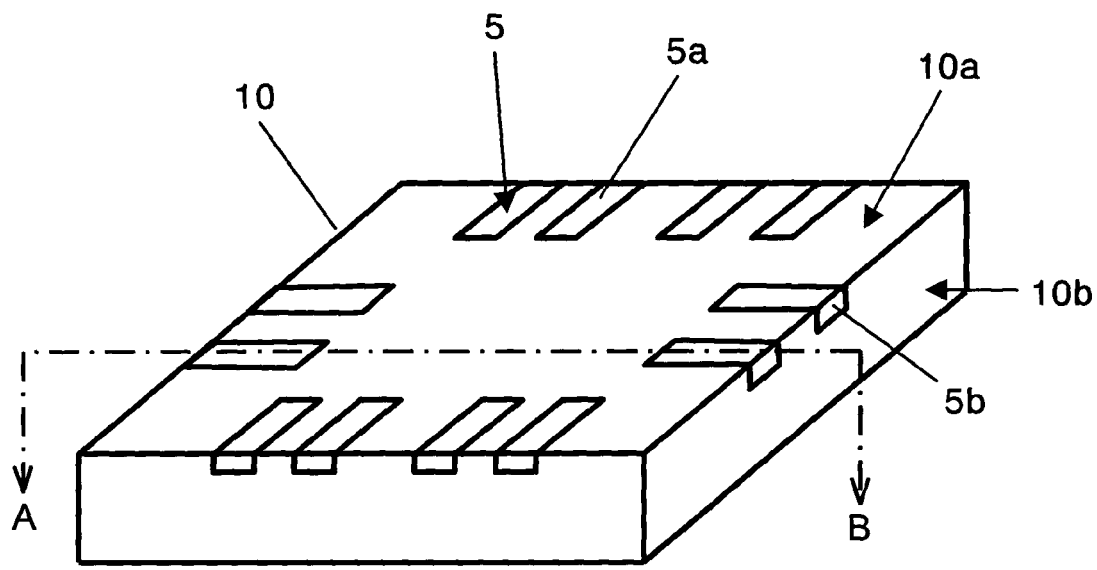
FIG. 3(a) is a perspective view used to describe a second example of surface acoustic wave device in accordance with the first embodiment.
Figure 3B:
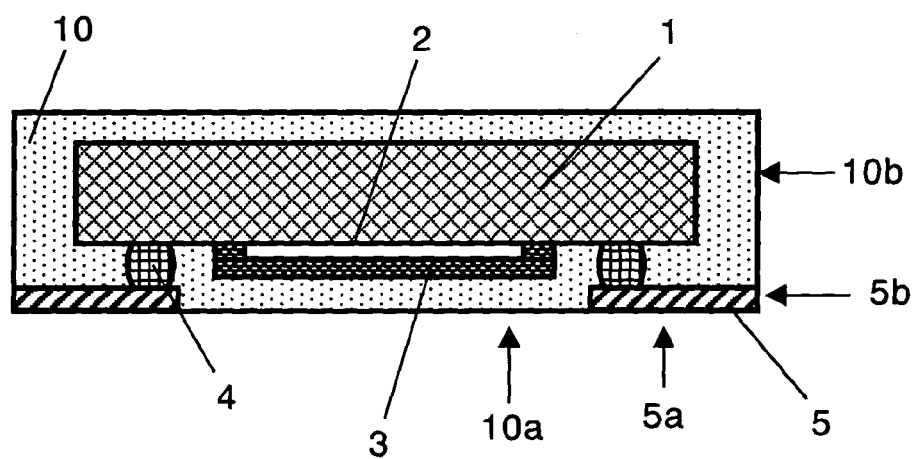
FIG. 3(b) is the cross sectional view sectioned along the line A-B of FIG. 3(a).

FIG. 3(a) is a perspective view of second example of surface acoustic wave device in embodiment 1, FIG. 3(b) is a cross sectional view of the surface acoustic wave device of FIG. 1(a) sectioned along the line A-B.

FIG. 3(a) shows a perspective view of the bottom surface of sealing resin observed from an oblique direction, the upper surface of the sealing resin is hidden in the other side of the drawing. The reverse face 5a of terminal electrodes 5 is exposed flush with the bottom surface 10a of sealing resin, while the side face 5b is exposed flush with the side surface 10b of sealing resin.

As shown in FIG. 3(b), a cross sectional view, a surface acoustic wave element is provided with a space formation member 3 which covers function region 2 of piezoelectric substrate 1, and a bump electrode 4 is provided on an electrode pad.

When a surface acoustic wave device whose terminal electrode at side face 5b is exposed flush with the side surface 10b of sealing resin is secondary-mounted, the side face 5b, not only the bottom face 5a, also becomes wet with solder expediting the solder flow. This contributes to make the solder thickness after processing even, and the height of surface acoustic wave device after mounting even. By the same reasons, void in the solder as well as defective connection are reduced.

Figure 4A:
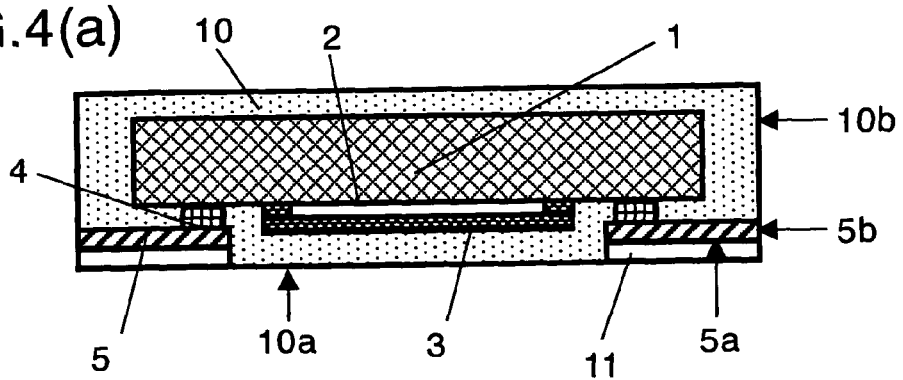
FIGS. 4(a), (b), (c) and (d) are cross sectional views used to describe, respectively, a third, a fourth, a fifth and a sixth examples of surface acoustic wave device in the first embodiment.

A third example which represents an improvement made on the second example in embodiment 1 is described referring to FIG. 4(a), a cross sectional view. The side face 5b of terminal electrode in the present third example is flush with the side surface 10b of sealing resin, but the bottom face 5a of terminal electrode is not flush with the bottom surface 10a of sealing resin. Namely, as shown in FIG. 4(a), the terminal electrode 5 is disposed in a hollow portion 11 of sealing resin. When such a surface acoustic wave device is secondary-mounted on a circuit board, mounting height of surface acoustic wave devices is kept at a certain fixed level, and there is no difficulty in the soldering connection because the side face 5b of terminal electrode is exposed in the side surface 10b of sealing resin. Furthermore, because of the terminal electrode 5 disposed in a hollow portion of resin, the height after secondary mounting can be suppressed to be lower than that with a device shown in FIG. 4(b).

Figure 4B:
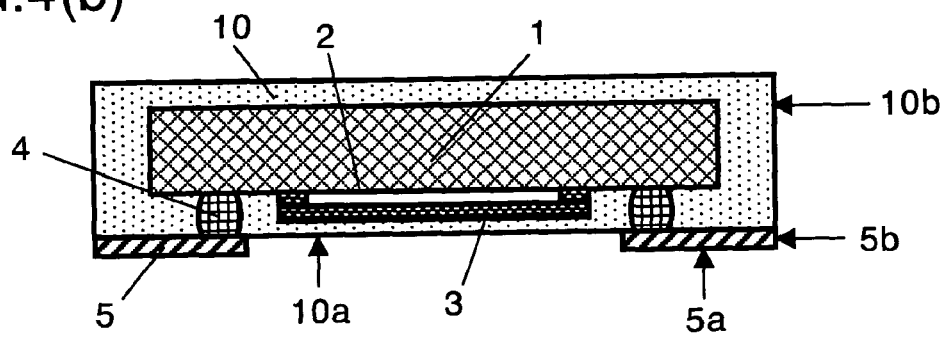

A fourth example in embodiment 1 is described referring to FIG. 4(b), a cross sectional view. Although terminal electrode of the fourth example at the side face 5b is flush with the side surface 10b of sealing resin, the bottom face 5a is protruding from the bottom surface 10a of sealing resin. The protruding bottom face 5a facilitates fluent flow of solder when secondary-mounting the device on a circuit board, which contributes to make the device height after mounting even and soldering connection more reliable. However, in a case where it opts for a lower height after secondary mounting, the earlier-described structure of FIG. 4(a) is more preferred.

Figure 4C:
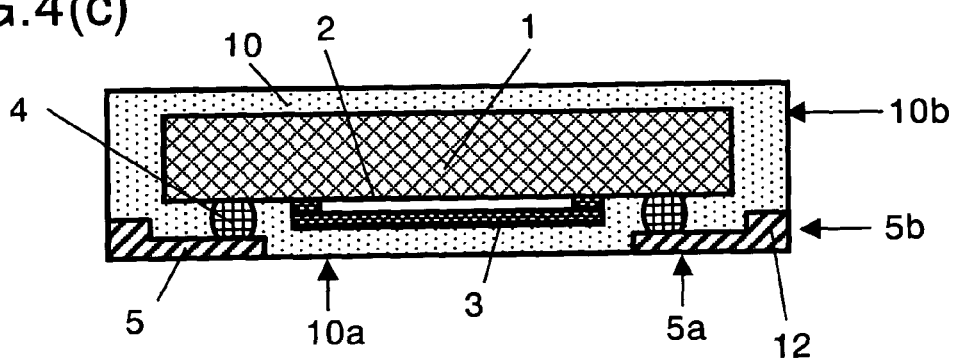

A fifth example in embodiment 1 is described referring to FIG. 4(c), a cross sectional view. The terminal electrode 5 has a thinner portion and a thicker portion 12 (hereinafter referred to as protruding portion of terminal electrode), and bump electrode 4 is connected to the thinner portion of terminal electrode 5. Bottom face 5a of terminal electrode is flush with bottom surface 10a of sealing resin, and side face 5b of protruding portion 12 of terminal electrode is flush with side surface 10b of sealing resin.

In the above-configured surface acoustic wave device, the protruding portion 12 of terminal electrode brings about a greater contact area between terminal electrode 5 and sealing resin 10, resulting in an increased terminal strength. Furthermore, since the side face 5b of protruding portion 12 of terminal electrode is flush with side surface 10b of sealing resin, solder during secondary mounting can flow up to this portion, which contributes to make height of devices after mounting still more even. Still further, an enlarged area of protruding portion 12 of terminal electrode exposed in the side surface 10b of sealing resin enhances strength of the terminal accordingly.

Figure 4D:
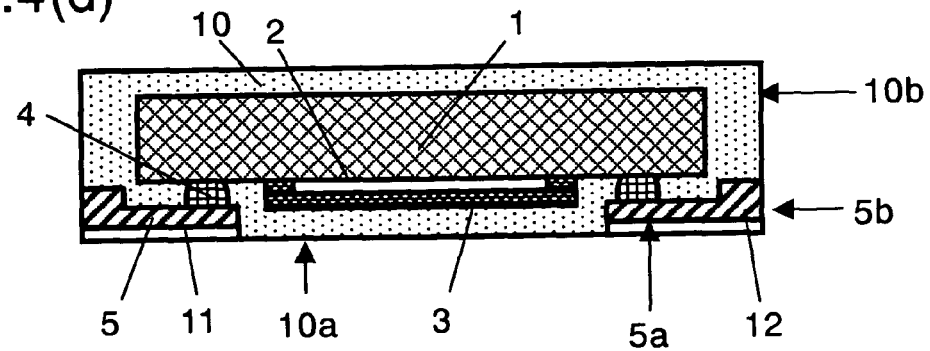

A sixth example in embodiment 1 is described referring to FIG. 4(d), a cross sectional view. The structure of sixth example is a combination of the third example shown in FIG. 4(a) and the fifth example shown in FIG. 4(c). Advantages in the respective examples are integrally implemented.

What is significant among the advantages is in the lowering of the device height after secondary mounting. This is because a clearance between the bottom surface 10a of sealing resin and circuit board can be readily reduced, since a superfluous solder at secondary mounting can escape to the side face 5b. Furthermore, since the efforts for precisely controlling the amount of cream solder to be printed on a circuit board can be alleviated, it offers another advantage also in the cost reduction and yield rate improvement during production.

In the above-described examples from the second through the sixth in embodiment 1, the space formation member 3 for protecting function region 2, viz. an area of comb-like electrodes, on piezoelectric substrate 1, is formed of an wall 3a and a lid 3b. The bottom face 5a of terminal electrode is disposed flush with bottom surface 10a of sealing resin, or disposed hollowed therefrom. Therefore, a space between circuit board and surface acoustic wave device after secondary mounting can be made smaller to a still lowered height. Furthermore, in a case where a circuit board is resin-molded after secondary mounting, the withstanding capability in a reflow test which is conducted in succession to a moisture absorption test (hereinafter referred to as moisture-absorption reflow test) improves because of the small clearance between circuit board and surface acoustic wave device. Thus the device reliability improves. The secondary mounting can be made on either a standard printed board used in portable telephone unit, etc. or a specific substrate mounted with a certain specific element. An example of the latter case is; a semiconductor device, or the like electronic component, mounted on the surface of an element of laminated ceramic filter.

There is another case in which a circuit board is provided with a terminal, and the entirety is used as a component; which is so-called a high frequency module. Such module can be downsized and low-profiled when a compact and low-profiled surface acoustic wave device in the present embodiment is used therein.

(Embodiment 2)

Figure 5A:
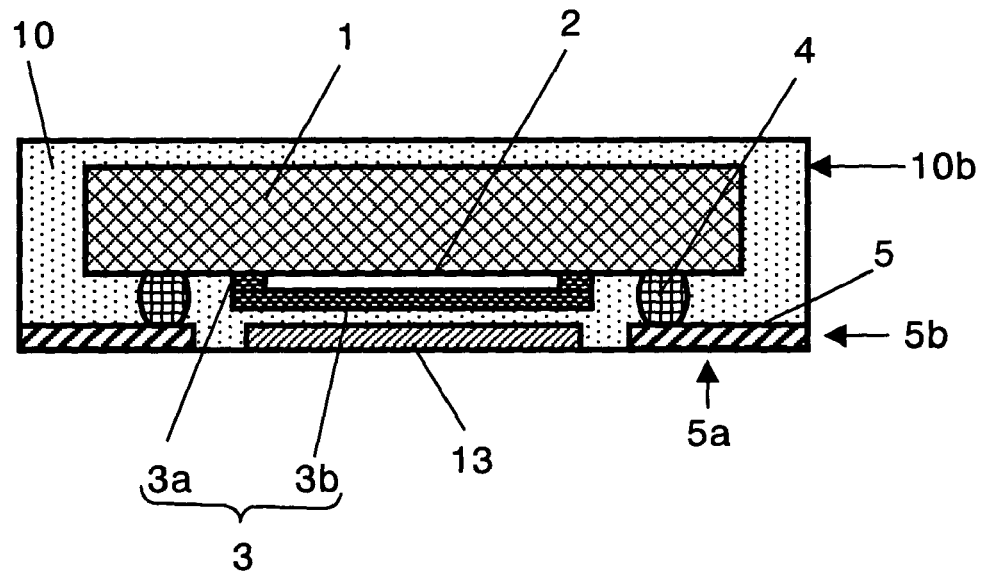
FIGS. 5(a), (b) are cross sectional views used to describe, respectively, a first and a second examples in a second exemplary embodiment.

A first example of surface acoustic wave device in accordance with a second exemplary embodiment of the present invention is described referring to FIG. 5(a).

The first example shown in FIG. 5(a) uses a surface acoustic wave element, which comprises a piezoelectric substrate 1 provided with a function region 2, a space formation member 3 covering the function region 2, and a bump electrode 4 provided on the main surface; the bump electrode 4 is electrically connected with the terminal electrode, and the entire structure is sealed with a sealing resin 10. In addition, a conductor island 13 is provided corresponding to the function region 2. Thus, a thin and compact surface acoustic wave device having the above-described structure where the surface acoustic wave element is built in and the function region 2 is protected with respect to electro-magnetic property and reliability by the conductor island 13 is implemented.

That it is "protected with respect to electromagnetic property" means that the function region 2 of surface acoustic wave device is well shielded from the electromagnetic fields. In a case where a surface acoustic wave device is used in UHF or a higher band zone, or where it is mounted mixed with other high frequency device to form e.g. a high frequency module, the advantage becomes more significant, among other cases.

That it is "protected with respect to reliability" means that the comb-like electrode for exciting surface acoustic wave and the lead electrode, pad electrode, etc. for inputting/outputting electric signals to the comb-like electrodes are well protected against corrosion that could be caused by humidity, or other item, sneaking into the function region 2. Although mechanism of the corrosion has not been thoroughly clarified yet, supposed reasons include a metal corrosion due to difference in the ionization tendency with hydrogen ion contained in invading water content, and a galvanic corrosion due to difference in the potential between a main material of the comb-like electrode, e.g. aluminum and other metal material. The other metal material can be copper, which has been alloyed with aluminum used as the main material for the comb-like electrode. In some practical cases, comb-like electrode is made of aluminum mixed with copper by a 0.5—several % for enhancing the anti-migration property. For the same purpose, titanium or the like material is sometimes used. If gold or the like metal having a higher potential than aluminum is used for an electrode pad, the galvanic corrosion becomes significant. If sealing resin 10 or space formation member 3 contains an erosive halide or the like impurities, it will be ionized by humidity in the air and existing in the function region of a surface acoustic wave device. This further expedites the above-described process of corrosion. If sealing resin 10 or space formation member 3 contains an organic acid or the like acidic material as the impurities, such material is be likewise existing in the function region. This provides an acidic environment in the function region to expedite the process of corrosion. Besides the above-described, it is also possible that the impurities intrude in the function region of a surface acoustic wave device at the production floor, and still existing even after the device is completed. It also expedites the process of corrosion. Water normally sneaks into the function region in a gaseous state, but it can turn into liquid by dew condensation. In this case, the corrosion becomes more significant. In order to alleviate the corrosion, the length of moisture path should be made as long as possible and the cross sectional area should be made as small as possible. A conductor island 13 is provided in the present embodiment at a place corresponding to the lid 3b, which place of lid forming the greatest cross sectional area at the shortest length for the moisture path. Thus, a surface acoustic wave device that is protected with respect to the reliability is implemented. In a surface acoustic wave device of FIG. 5(a), wall 3a and lid 3b, which being constituents of the space formation member 3, may be glued to the conductor island 13 with an adhesive agent, or by means of sealing resin 10.

Figure 5B:
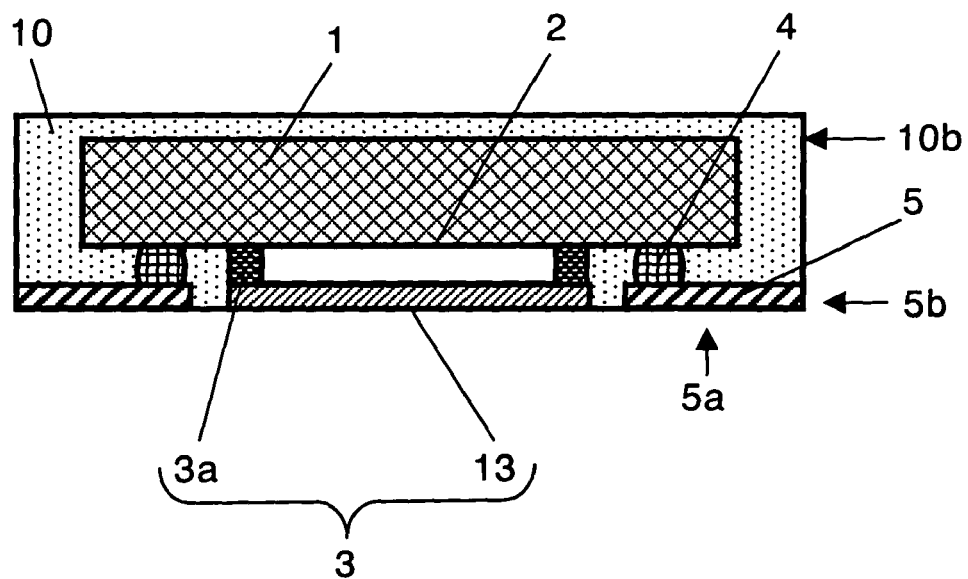

Next, a second example in embodiment 2 is described referring to FIG. 5(b). Description is made only on point of difference from the first example of FIG. 5(a). The space formation member 3 for covering function region 2 in the second example is formed of a wall 3a and a conductor island 3b, as shown in FIG. 5(b). The wall 3a and the conductor island 13 may be attached together either by means of compressive adhesion or with an adhesive agent. In whichever case, the overall thickness can be reduced without sacrificing the reliability.

In both of the first and the second examples in embodiment 2, it is preferred that the terminal electrode at the side face 5b is flush with the side surface 10b of sealing resin. However, the bottom face 5a of terminal electrode 5 may either be flush with sealing resin 10, hollowed, or protruded therefrom. The terminal electrode 5 may assume a shape in which there is a protruding portion 12 at a place outer than the place of connection with bump electrode 4.

Also the conductor island 13 should preferably be flush with terminal electrode 5; and the conductor island 13 may be connected with at least one of the terminal electrodes 5.

It is preferred that in both the embodiment 1 and embodiment 2, the bump electrode 4 is made of a metal containing at least one among the group of gold, tin, copper, lead and silver; while the terminal electrode 5 and the conductor island 13 have a laminate structure formed of a layer containing gold as the main ingredient and a layer formed of metal material other than gold.

(Embodiment 3)

A first example of method for manufacturing surface acoustic wave device in accordance with a third exemplary embodiment of the present invention is described referring to the drawings.

Figure 6A:
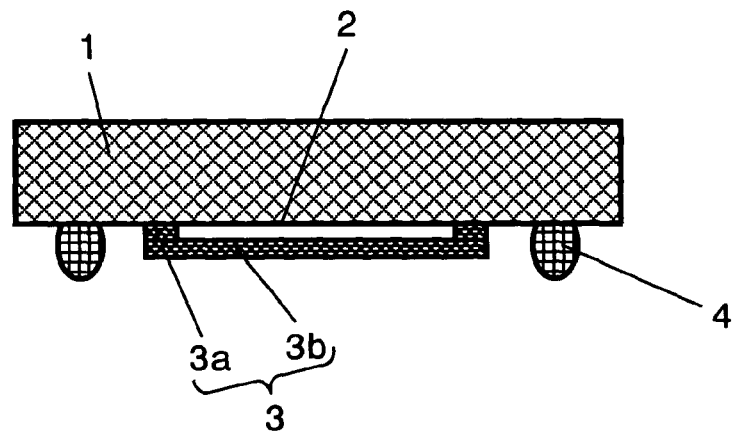
FIG. 6(a)-(c) are cross sectional views showing the process steps, used to describe a first example of method for manufacturing surface acoustic wave devices in accordance with a third embodiment of the present invention.
Figure 6B:
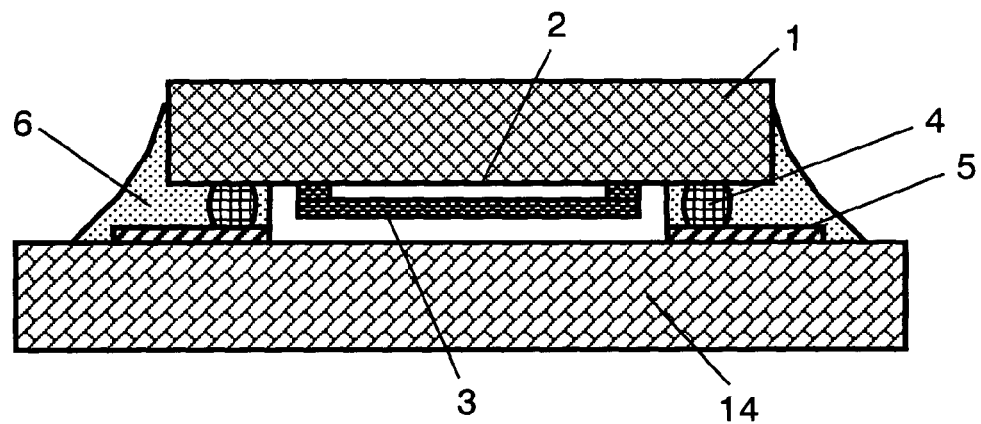
Figure 6C:
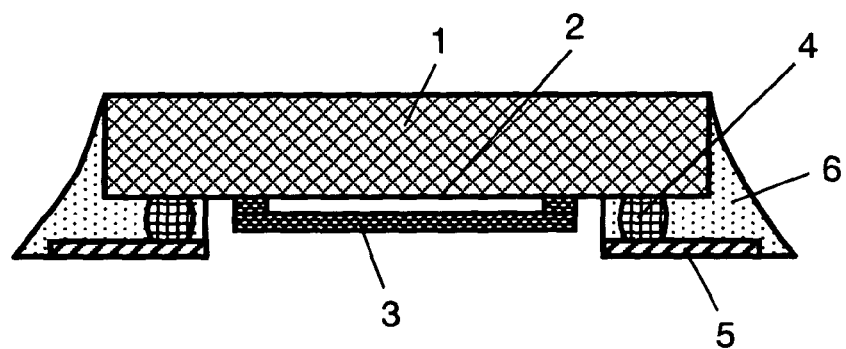
Figure 7A:
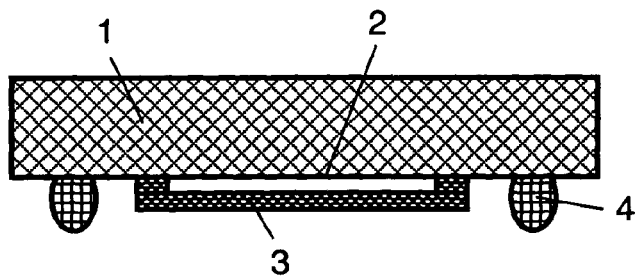
FIG. 7(a)-(d) are cross sectional views showing the process steps, used to describe a second example of method for manufacturing surface acoustic wave devices in accordance with a third embodiment of the present invention.
Figure 7B:
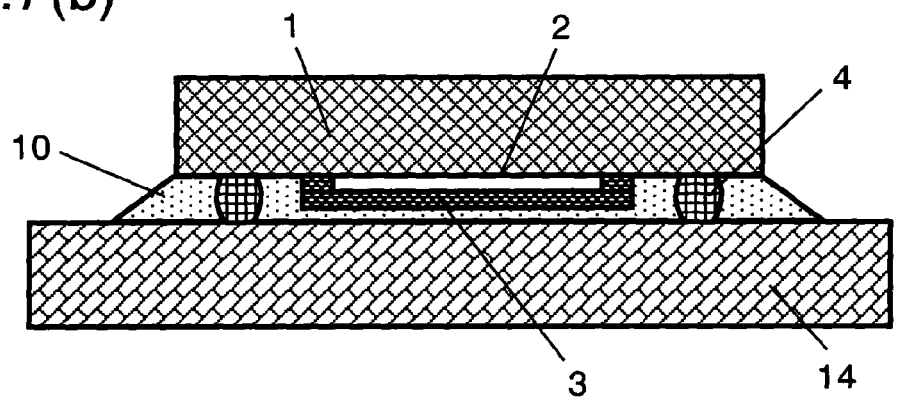
Figure 7C:
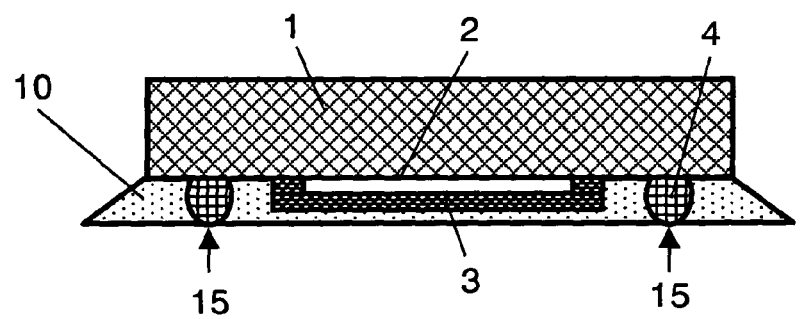
Figure 7D:
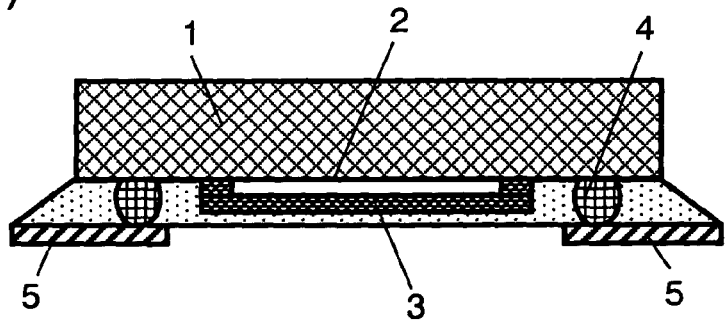

FIG. 6(*a*) through (*c*) are cross sectional views showing the process steps used to describe a first example of manufacturing method of surface acoustic wave device in accordance with the third embodiment of the present invention.

As shown in FIG. 6(*a*), a surface acoustic wave element is prepared, which element comprising a piezoelectric substrate 1 provided with a function region 2 having comb-like electrodes, etc., an electrode pad (not shown), and a bump electrode 4 formed on the surface, the function region 2 being covered with a space formation member 3.

The comb-like electrode and the electrode pad of surface acoustic wave element are formed by a sputtering process and a photolithography. The comb-like electrode is made with aluminum, or an aluminum alloy, e.g. copper aluminum alloy, copper aluminum scandium alloy.

The space formation member 3 is formed by an wall 3*a* and a lid 3*b*. The wall 3*a* is formed by first laminating a dry film resist and patterning it through photolithography, and then the lid 3*b* by the same procedure.

The bump electrode 4 is formed by ball-bonding a gold wire on electrode pad and then pulling the wire off. Besides the above method, it can be formed also by a solder bump method, a method using solder ball, copper ball, etc., or a plating process.

Next, as shown in FIG. 6(*b*), the bump electrode 4 is pressed on to terminal electrode 5 provided on a carrier 14 to be electrically connected together by means of ultrasonic wave. A resin 6 is applied between the piezoelectric substrate 1 and a carrier 14, and cured.

Then, the carrier 14 is peeled off to complete a finished surface acoustic wave device as shown in FIG. 6(*c*). Although FIG. 6(*c*) shows only a cross sectional view, the resin 6 is surrounding the circumference of piezoelectric substrate 1. Although FIG. 6(*c*) illustrates an example in which the space formation member 3 is not covered by resin 6, the entire bottom surface of piezoelectric substrate 1 including the space formation member 3 may be covered with resin 6, excluding the bottom face of terminal electrode 5.

The carrier 14 having terminal electrodes 5 as shown in FIG. 6(*b*) is manufactured as follows.

A metal layer of the same material for the terminal electrode, such as copper, is formed covering the entire surface of carrier 14. Basically there is no limitation with respect to the material for carrier 14; copper, for example, may be used. A thin separation layer (not shown) is provided between the metal layer and the carrier for easier peeling at a later stage. A resist pattern is formed on the metal layer with a place corresponding to terminal electrode open. A plated layer of nickel, gold is formed by electrolytic plating, using the metal layer as an electrode. After removing the resist pattern, the metal layer is etched using the plated layer as mask, and a terminal electrode 5 is completed.

When etching the metal layer, the peeling layer and part of carrier may be etched at the same time. By so doing, the terminal electrode can be made to be recessed from the resin surface applied in the surrounding. Thus a height difference in the step between bottom surface of terminal electrode 5 and bottom surface of resin 6 can be controlled to be approximately 5–50 $\mu$m, which makes a further contribution for reducing the overall height.

Although the bump electrode and the terminal electrode in the present first example are connected by ultrasonic means, the two items can be connected together instead by heating if they are provided at respective surfaces with a metal layer that melts at heating. Furthermore, if the carrier is made of a conductive material and the terminal electrode is electrically connected with the carrier, electrode pads of a surface acoustic wave element get short-circuited when the element is mounted on the carrier. This is advantageous in preventing an electrostatic destruction and a pyroelectric damage on the production line.

Next, a second example of method of manufacturing surface acoustic wave device in accordance with a third exemplary embodiment of the present invention is described referring to FIG. 7(*a*) through (*d*).

Referring to FIG. 7(*a*), a surface acoustic wave element is prepared, which element comprising a piezoelectric substrate 1 provided with a function region 2, a space formation member 3 and a bump electrode 4 formed on the main surface. The element is mounted on a carrier 14 having no terminal electrode, and a sealing resin 10 is applied between piezoelectric substrate 1 and carrier 14, and cured. And then, the surface acoustic wave element sealed with sealing resin 10, shown in FIG. 7(*c*), is peeled off the carrier 14. It is essential that the tip end 15 of bump electrode 4 is exposed. Then, a terminal electrode 5 is formed connected with the bump electrode 4, as illustrated in FIG. 7(*d*).

The terminal electrode 5 can be formed by means of vacuum vapor deposition or a film forming process, or by printing a conductive resin and baking it.

In the description of the first and the second examples, a surface acoustic wave element is pressed on to the carrier and then resin 6 is applied. Instead, the surface acoustic wave element or the carrier 14 may be provided in advance with a resin 6 on the surface, and then curing the resin 6 after the element and the carrier are connected together.

(Embodiment 4)

FIG. 8(*a*) through (*f*) are cross sectional views showing the process steps used to describe a first example of manufacturing method of surface acoustic wave device in accordance with a fourth embodiment of the present invention.

In the first place, a transference member is prepared by laminating a separation layer 16 and a metal layer 17 on a carrier 14 at the main surface, as shown in FIG. 8(*a*).

A resist pattern 18 is formed on an area which eventually makes a terminal electrode, as shown in FIG. 8(*b*). The metal layer 17 is etched off using the resist pattern 18 as mask to provide a terminal electrode 5. Resist pattern 18 is removed. As shown in FIG. 8(*c*), a surface acoustic wave element 19 is connected, with the bump electrode 4 on a main surface of terminal electrode 5. Then, as shown in FIG. 8(*d*), it is covered entirely with a sealing resin 10. Terminal electrode 5 and sealing resin 10 are peeled off at the separation layer 16, to obtain a structure as shown in FIG. 8(*e*).

Figure 8A:
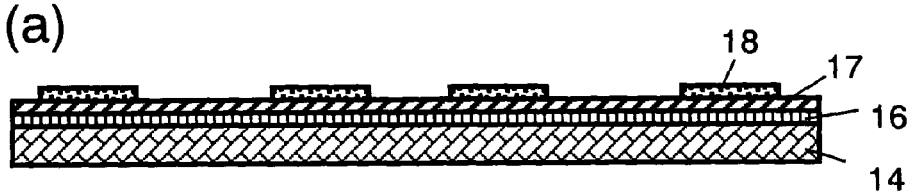
FIG. 8(a)-(f) are cross sectional views showing the process steps, used to describe a first example of method for manufacturing surface acoustic wave devices in accordance with a fourth embodiment of the present invention.
Figure 8B:
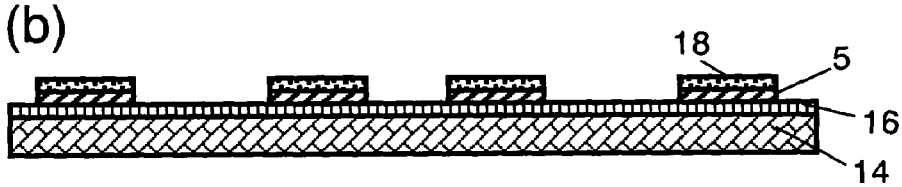
Figure 8C:
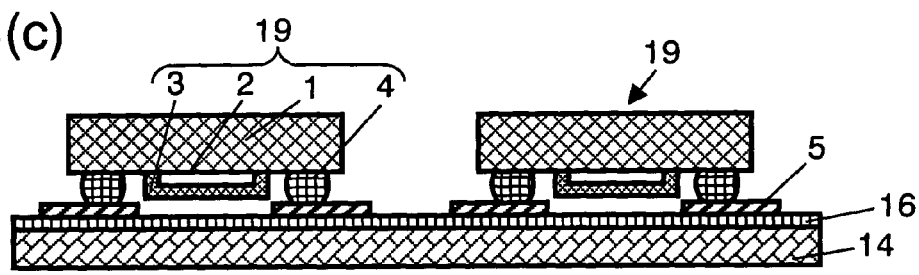
Figure 8D:
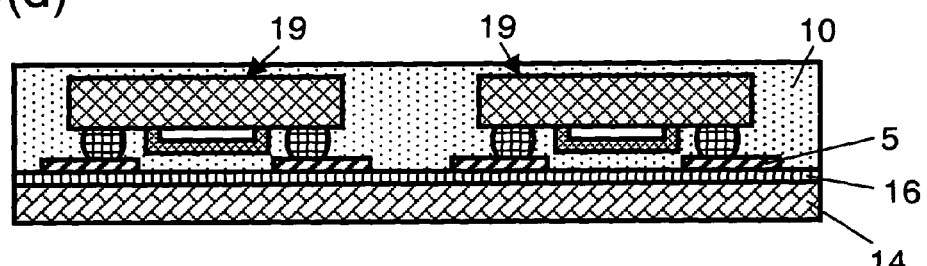
Figure 8E:
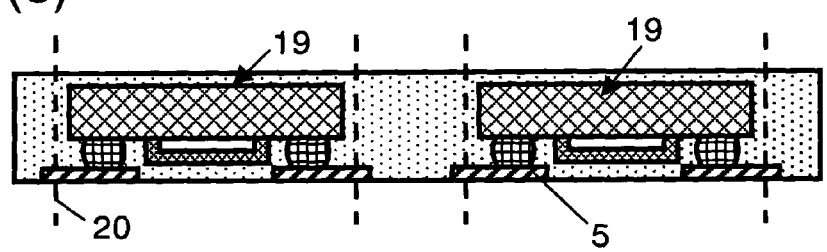
Figure 8F:
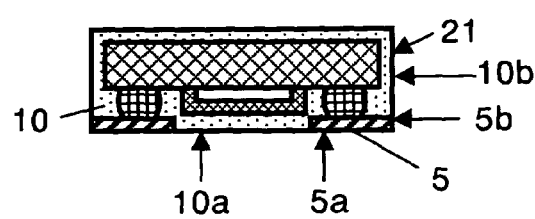

Then, it is separated by cutting sealing resin 10 and terminal electrode 5 along imaginary cut lines 20 shown in FIG. 8(e) indicated with dotted lines, to obtain individual surface acoustic wave devices shown in FIG. 8(f). In this way, a surface acoustic wave device that has a terminal electrode 5 flush with the bottom surface 10a of sealing resin and the side face 5b flush with the side surface 10b of sealing resin is implemented.

Next, a second example, which is an improvement of the first example in the terminal electrode, is described referring to the drawings.

FIG. 9(a) through (d) are cross sectional views showing the process steps of the second example. Process steps after FIG. 9(d) remain the same as those after FIG. 8(d).

Figure 9A:
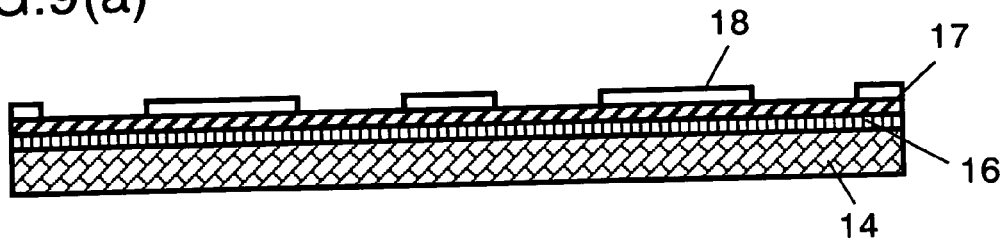
FIG. 9(a)-(d) are cross sectional views showing the process steps, used to describe a second example of method for manufacturing surface acoustic wave devices in accordance with a fourth embodiment of the present invention.

As shown in FIG. 9(a), a transference member is prepared by laminating a separation layer 16 and a metal layer 17 on the main surface of a carrier 14. A so-called reverse resist pattern 18 is formed on the main surface of metal layer 17, which resist having an opening in an area which eventually makes a terminal electrode.

Figure 9B:
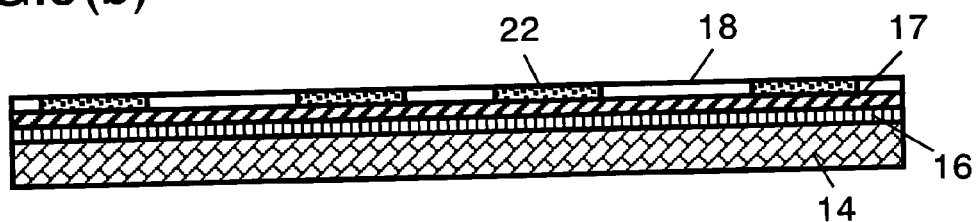
Figure 9C:
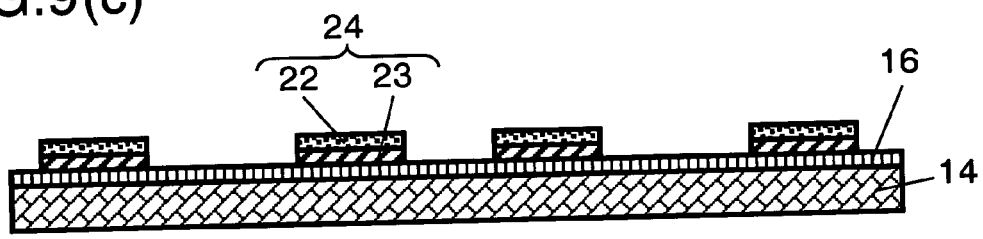

As shown in FIG. 9(b), a plated layer 22 of gold or other material is provided in the opening by using the resist pattern 18 as mask. Resist pattern 18 is removed, and then metal layer 17 is etched off using the plated layer 22 as mask. Thus a complex terminal electrode 24 formed of a laminated body of metal layer 23 and plated layer 22, as shown in FIG. 9(c). As to a material for the plated layer 22, it is preferred to select such a material which is different from metal layer 17, separation layer 16 and carrier 14 in at least one item among the etchant and the etching rate.

Figure 9D:
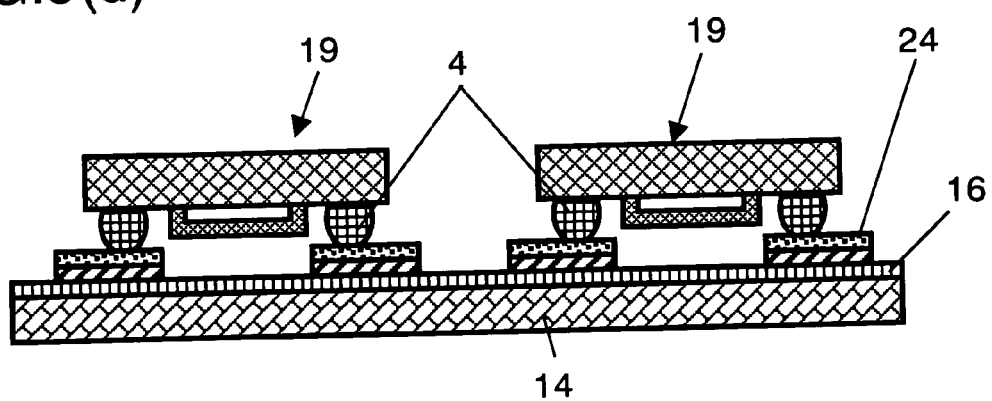

As shown in FIG. 9(d), a surface acoustic wave element 19 is connected, with the bump electrode 4 on the complex terminal electrode 24. The process steps after this remain the same as those shown in FIG. 8(d) through (f).

In the present second example, the complex terminal electrode 24 is provided with a plated layer 22 formed on the main surface. By selecting a metal that makes a good connection with the bump electrode 4 for the plated layer 22, reliability in the connection is improved.

Next, a third example, which is an improvement of the first example in the terminal electrode, is described with reference to the drawings.

Figure 10A:
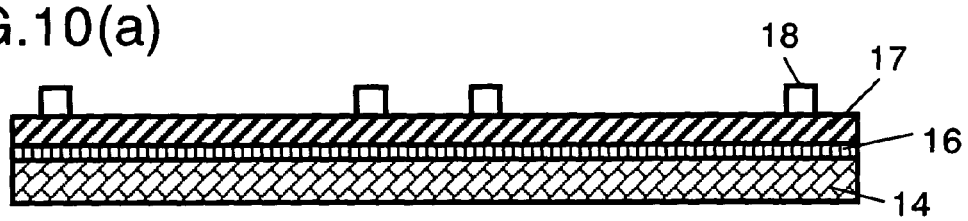
FIG. 10(a)-(e) are cross sectional views showing the process steps, used to describe a third example of method for manufacturing surface acoustic wave devices in accordance with a fourth embodiment of the present invention.
Figure 10B:
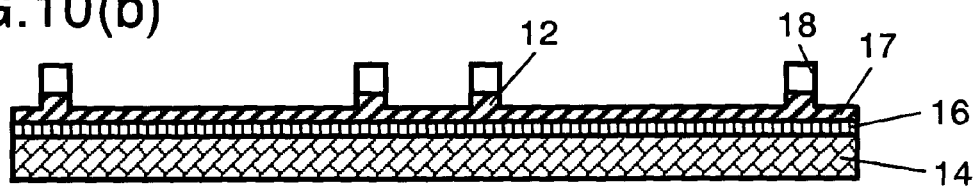
Figure 10C:
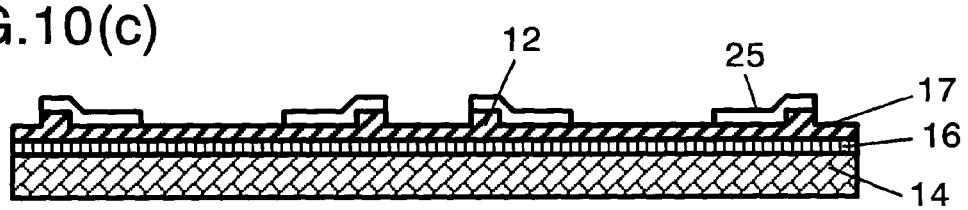
Figure 10D:
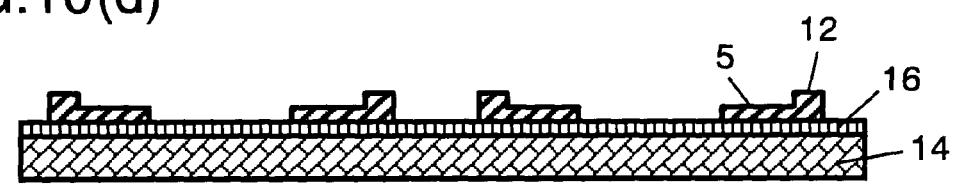
Figure 10E:
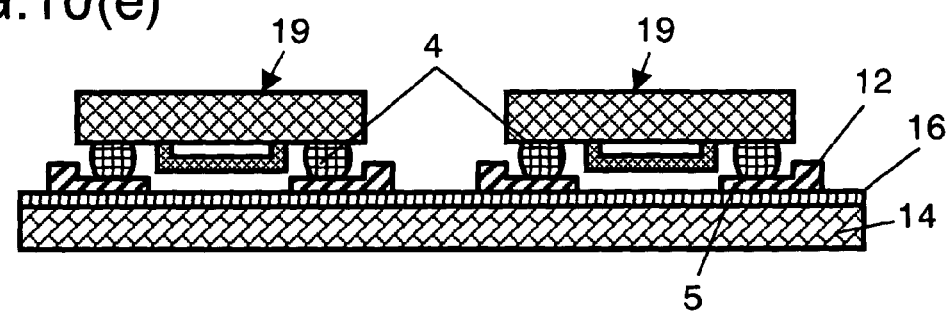

FIG. 10(a) through (e) are cross sectional views showing the process steps, used to describe the third example; steps after FIG. 10(e) remain the same as those after FIG. 8(d).

In the first place, a transference member is prepared by laminating a separation layer 16 and a metal layer 17 on the main surface of a carrier 14, as shown in FIG. 10(a). On the metal layer 17, a resist pattern 18 is formed covering an area which eventually makes a protruding portion of terminal electrode.

As shown in FIG. 10(b), the metal layer 17 is etched for a certain depth from the upper surface using the resist pattern 18 as mask. An area which eventually makes the protruding portion 12 of terminal electrode is thus formed. Resist pattern 18 is removed.

As shown in FIG. 10(c), a second resist pattern 25 having the shape of terminal electrode is provided covering the protruding area either. Metal layer 17 is etched off using the second resist pattern 25 as mask, to form a terminal electrode 5 having protruding portion 12 as shown in FIG. 10(d).

A surface acoustic wave element 19 is connected, as shown in FIG. 10(e), with the bump electrode 4 on terminal electrode 5. The process steps after this remain the same as those shown in FIG. 8(d) through (f). The cutting into individual devices is made at the protruding portion 12 of terminal electrode.

Next, a fourth example, which is an improvement of the first example in the terminal electrode, is described with reference to the drawings.

Figure 11A:
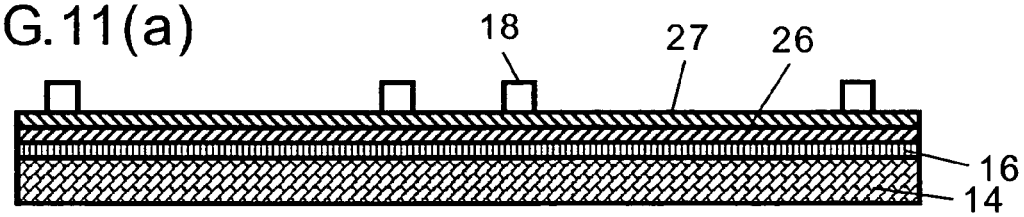
FIG. 11(a)-(e) are cross sectional views showing the process steps, used to describe a fourth example of method for manufacturing surface acoustic wave devices in accordance with a fourth embodiment of the present invention.
Figure 11B:
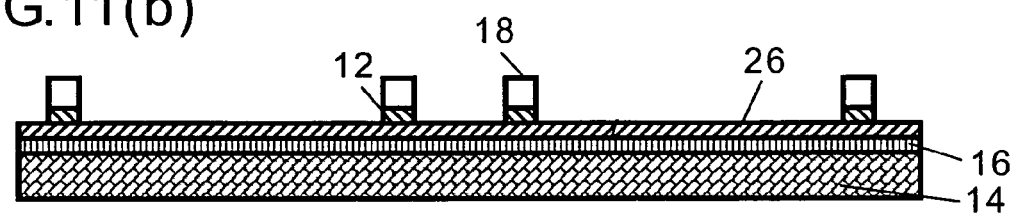
Figure 11C:
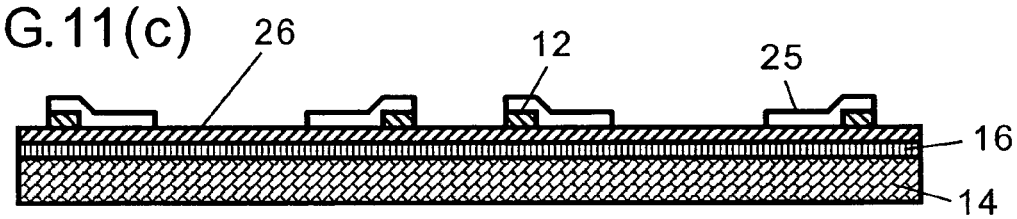
Figure 11D:
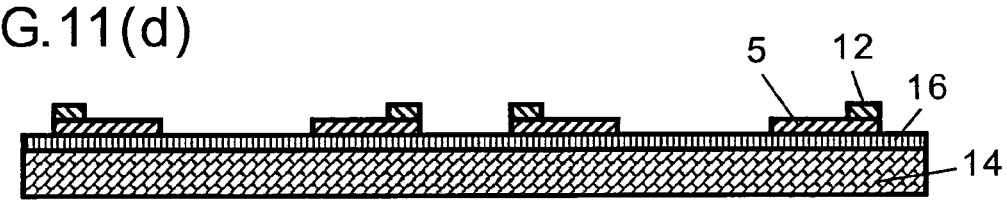
Figure 11E:
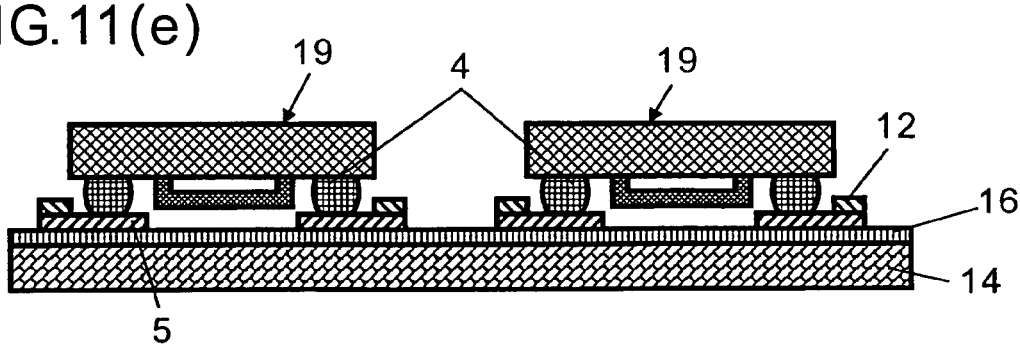

FIG. 11(a) through (e) are cross sectional views showing the process steps, used to described the fourth example; steps after FIG. 11(e) remain the same as those after FIG. 8(d).

In the first place, a transference member is prepared by laminating a separation layer 16, a first meal layer 26 and a second metal layer 27 on the main surface of carrier 14, as shown in FIG. 11(a). It is preferred to select a material for first metal layer 26 and second metal layer 27, respectively, so that the layers are different to each other in at least one item among the etchant and the etching rate. The etchant in the present context refers to an etching gas when etching is conducted with gas, or an etching liquid when etching is conducted through a wet etching process. A resist pattern 18 for providing a protruding portion is formed on the second metal layer 27.

As shown in FIG. 11(b), the second metal layer 27 is etched off using resist pattern 18 as mask, to provide a protruding portion 12. Resist pattern 18 is removed.

As shown in FIG. 11(c), a second resist pattern 25 having the shape of terminal electrode is provided covering the protruding area 12. The first metal layer 26 is etched off with the second resist pattern 25 as mask, to form a terminal electrode 5. Second resist pattern 25 is removed to obtain the profile of FIG. 11(d).

A surface acoustic wave element 19 is connected, as shown in FIG. 11(e), with the bump electrode 4 on terminal electrode 5. The steps after this remain the same as those shown in FIG. 8(d) through (f). It is cut at the protruding portion 12 of terminal electrode for separating it into individual surface acoustic wave devices.

In the above-described examples 1 through 4, a conductor island as illustrated in FIG. 5(a) can be provided at the same time when the terminal electrode is formed. By providing a region for the conductor island in the photo mask for forming terminal electrode, a conductor island can be provided without modifying the current manufacturing procedure. In this case, a lid 3b of space formation member 3 is fixed to the conductor island by means of adhesive agent or sealing resin 10 when mounting a surface acoustic wave element on carrier 14. In a case where the space formation member 3 is formed of wall 3a alone, the attaching is made with an adhesive agent applied on at least one item among the top face of wall 3a and the conductor island.

In the above-described examples 1 through 4, when a conductive material is used for at least separation layer 16, individual terminal electrodes are connected in common by the separation layer 16; therefore, a surface acoustic wave element can be fully protected from the electrostatic destruction or the pyroelectric damage at the production floor. When conductive material is used in both the separation layer 16 and the carrier 14, the protection against electrostatic destruction and pyroelectric damage becomes to be further perfect. In practice, favorable results have been confirmed with, for example, a carrier 14 made of copper foil, a separation layer 16 containing chromium or nickel as the main material, and a metal layer 17 and a second metal layer 27 both made of copper foil.

In the above-described examples 1 through 4, if carrier 14 is slightly etched at the surface during the process for forming terminal electrodes, the surface acoustic wave device can be peeled off the carrier more easily. This contributes to a higher production efficiency and yield rate in the present manufacturing method. In this case, however, since the separation layer 16 underneath terminal electrode 5 is made to be isolated, the separation layer 16 and the carrier 14 have to be made of a conductive material in order to prevent the electrostatic destruction and the pyroelectric damage.

Furthermore, in the above-described examples 1 through 4, one terminal electrode among a group of terminal electrodes and other one among another group of terminal electrodes can be provided in a continued arrangement, where an end of one terminal electrode continues to an end of other terminal electrode. A typical of such arrangement is shown in FIGS. 12(a) and (b).

Figure 12A:
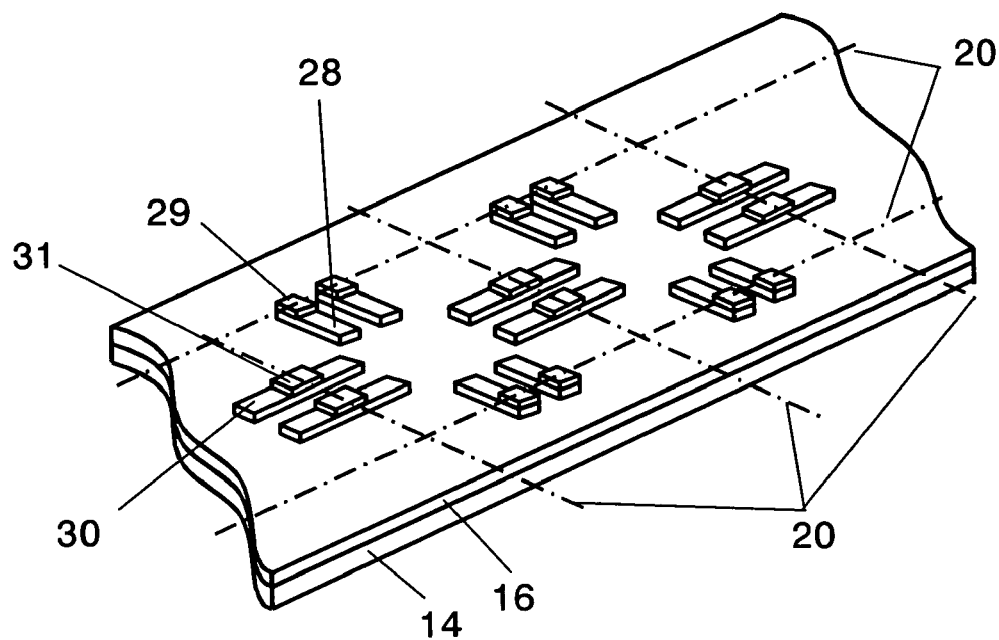
FIG. 12(a), (b) are perspective views, used to describe an example of forming terminal electrodes in the manufacturing method in accordance with a fourth exemplary embodiment of the present invention.

FIG. 12(a) shows an example of carrier tape 14, on which a surface acoustic wave element is disposed and mounted in a certain specified area. A region specified with imaginary cut lines 20 corresponds to an individual resin sealed surface acoustic wave device. A first lead 28 with a protruding portion 29 is a detached terminal electrode, while a second lead 30 with a protruding portion 31 is that of continued arrangement, where adjacent terminal electrodes are coupled together at their protruding portion.

Figure 12B:
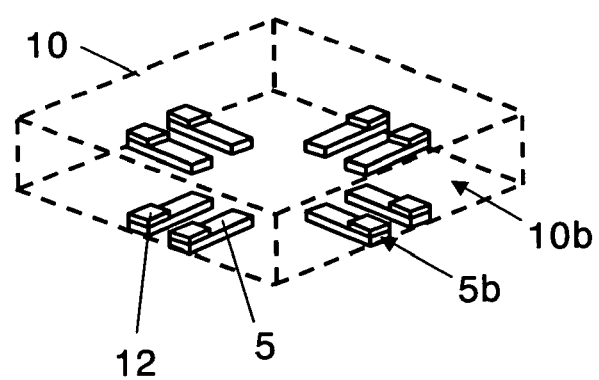

FIG. 12(b) is an imaginary view showing a state where a surface acoustic wave element is mounted on the carrier tape 14 at the certain specified area shown in FIG. 12(a) and sealed with resin, and then it is cut into an individual device at the location of protruding portion.

When the devices are manufactured using terminal electrodes in a continued state as described above, surface acoustic wave elements can be disposed at a smaller interval. That the coupled lead is cut at the middle to provide terminal electrodes contributes to eliminate the loss of materials.

(Embodiment 5)

FIG. 13(a) through (e) are cross sectional views showing the process steps, used to describe a first example of manufacturing method of surface acoustic wave device in accordance with a fifth exemplary embodiment of the present invention.

Figure 13A:
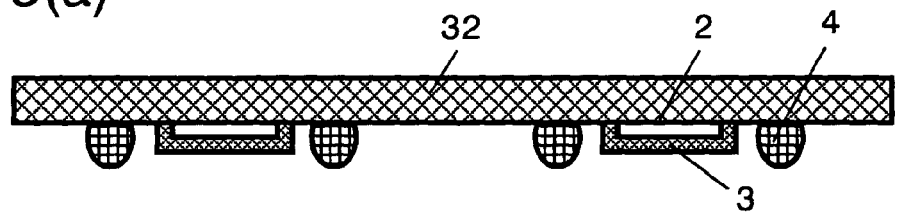
FIG. 13(a)-(e) are cross sectional views showing the process steps, used to describe a first example of method for manufacturing surface acoustic wave devices in accordance with a fifth exemplary embodiment of the present invention.

As shown in FIG. 13(a), a plurality of surface acoustic wave elements each comprising a piezoelectric wafer 32 provided on the main surface with a function region 2, a space formation member 3 and a bump electrode 4 are prepared. The space formation member 3 for protecting function region 2 is provided by first forming an wall using a film resist, and then forming a lid using a film resist.

Figure 13B:
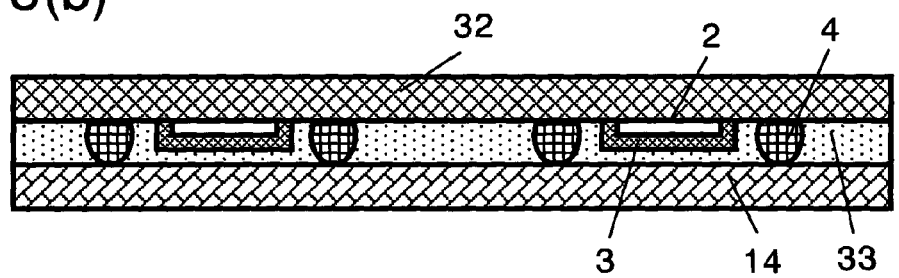

Then, as shown in FIG. 13(b), electrode pad 4 of surface acoustic wave element is pressed onto a carrier 14, and a sealing resin 33 is applied in a space between wafer 32 and carrier 14, and cured.

Figure 13C:
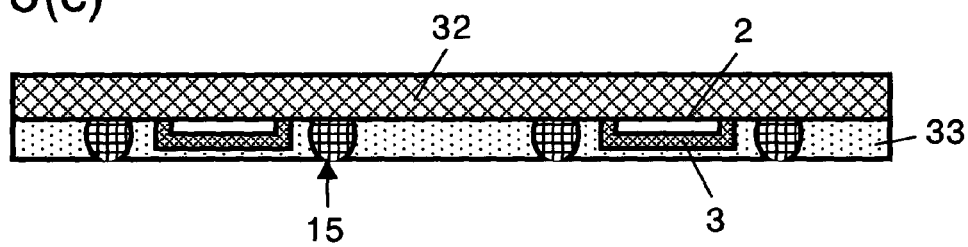
Figure 13D:
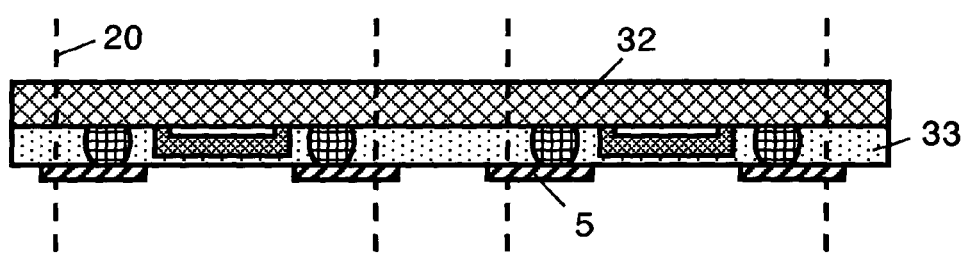
Figure 13E:
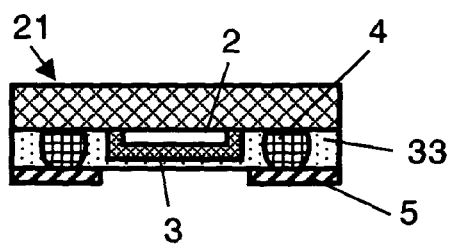

Then, as shown in FIG. 13(c), carrier 14 is peeled off to have a tip end 15 of bump electrode 4 exposed. And then, as shown in FIG. 13(d), a terminal electrode 5 is formed, with part of it overlapping to bump electrode 4. At this stage, an isolated conductor island or a conductor island coupled with a terminal electrode can be formed simultaneously. Next, terminal electrode 5, sealing resin 33 and wafer 32 are cut along a cut line 20 to obtain an individual surface acoustic wave device as shown in FIG. 13(e).

Referring to the process step of FIG. 13(b), there is an alternative procedure which uses no carrier 14. That is, a sealing resin 33 is provided on the main surface of a piezoelectric wafer 32, where a number of surface acoustic wave elements have been formed, using a dispenser, or by means of spin-coating, and then the wafer is ground or polished after the sealing resin was cured until the tip end of bump electrode 4 is exposed.

Terminal electrode 5 can be formed through the following processes.

After the processing is finished until the stage of FIG. 13(c), a conductive film is formed covering the whole surface of resin 33 by a sputtering process, an ion plating process, an electron beam deposition, a deposition by resistive heating, etc. And then, a terminal electrode 5 is formed by means of photolithography. For example, a photosensitive resist layer is formed on the whole surface, which is exposed and developed to a resist pattern. The conductive film is etched off using the resist pattern as mask, to provide a terminal electrode 5. Instead, a terminal electrode 5 can be provided direct; using a metal mask having an opening in an area corresponding to terminal electrode when forming the above-described conductive film on the wafer 32. In accordance with the above procedure, the processing can be simplified and the production cost can be lowered. Either one of the processes may be selected at option, depending on the shape, size and requirement in the accuracy level to be implemented with a terminal electrode 5. In the case of present embodiment, a photolithography was used since the space between adjacent terminal electrodes is as small as 0.3 mm–0.4 mm.

The terminal electrode 5 can be formed instead by a plating process. A photosensitive dry film resist is laminated over the whole surface of resin 33, and then the dry film resist is selectively removed for an area of plating by means of photolithography. And then, copper or the like material is plated after coring by palladium, etc. Nickel, gold, silver, tin, solder, etc. may be used for the plating, besides copper. Or some of these materials may be laminated. The point is that, the plating material facing to sealing resin 33 needs to have a good fastening property with the sealing resin 33, so that it does not peel off during and after secondary mounting. When a plated layer is formed in a multi-layered structure, the outermost layer can be selected among those materials having a high reliability with respect to secondary mounting. For example, when secondary mounting is performed by a reflow soldering, it is preferred that the outermost material is selected from among the group of copper, gold, silver, tin, solder, etc., each of which having a high wetting property with solder.

Still other alternative method is, first forming an underlayer by a sputtering process, an ion plating process, an electron beam deposition, a deposition by resistive heating, an electroless plating method, etc., and then applying further plating thereon. In this case, an electrolytic plating can be used, and the time needed for film formation can be reduced to a reduced manufacturing cost. Furthermore, the film thus formed has an increased intensity, which provides an enhanced blocking capacity against water moisture, etc., leading to an improved moisture-proof property.

Still further, a terminal electrode 5 may be formed by applying a conductive resin by a printing process, and curing it. For example, a metal mask having an opening corresponding to terminal electrode 5 is placed on the surface of sealing resin 33, and fixed thereon. An appropriate quantity of conductive resin is applied on the metal mask and spread on the surface of sealing resin 33 by a squeegee, and then cured by heating after the metal mask is removed. As to metal material contained in the conductive resin, normally those having a high electric conductivity, for example, gold, silver, copper, palladium, platinum, aluminum, iron, nickel, or an alloy of these metals, or these metals in a laminate structure are selected. In a case where secondary mounting is made by a reflow soldering, it is preferred to select a metal material containing copper as the main component, in order not to have a terminal electrode 5 eroded by solder and an electrically open state is caused. It is still more preferred if the copper is coated with gold or the like material that has a good wetting property with solder.

For the purpose of improving the electrical reliability in relation to bump electrode 4, thereby preventing the electrically off state, it is preferred to provide a thin film as an underlayer, and then providing a conductive resin thereon. The underlayer can be formed by means of the earlier-described electron beam, vacuum deposition or sputtering by resistive heating, ion plating, etc. Also, a plating method can used. The underlayer is advantageous also in terms of anti-moisture property; it enhances the performance of blocking water moisture, etc.

A conductor island may of course be formed at the same time when terminal electrode 5 is formed. Thus the above-described manufacturing method makes it possible to manufacture the surface acoustic wave devices through an easy procedure at the wafer level, which devices exhibiting superior properties in electromagnetic performance and in terms of reliability. The cost can be reduced substantially.

Now in the following, a second example of manufacturing method of surface acoustic wave device in accordance with a fifth embodiment of the present invention is described referring to the drawings.

FIG. 14(a) through (e) are cross sectional views showing the process steps, used to describe the second example of manufacturing method of surface acoustic wave device in accordance with a fifth embodiment of the present invention.

Figure 14A:
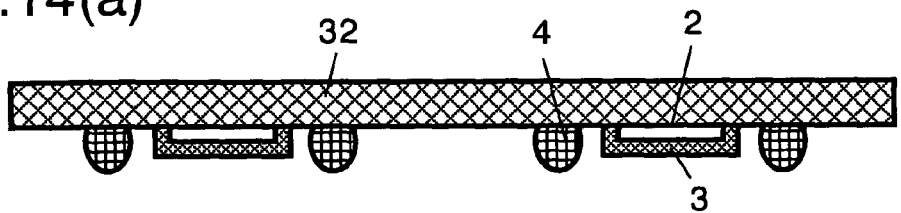
FIG. 14(a)-(e) are cross sectional views showing the process steps, used to describe a second example of method for manufacturing surface acoustic wave devices in accordance with a fifth exemplary embodiment of the present invention.

As shown in FIG. 14(a), a number of surface acoustic wave elements are formed on the main surface of a piezoelectric wafer 32, which surface acoustic wave element comprising a function region 2, a space formation member 3 and a bump electrode 4. The space formation member 3 for protecting function region 2 is provided by first forming a wall body using a film resist, and then a lid using a film resist.

Figure 14B:
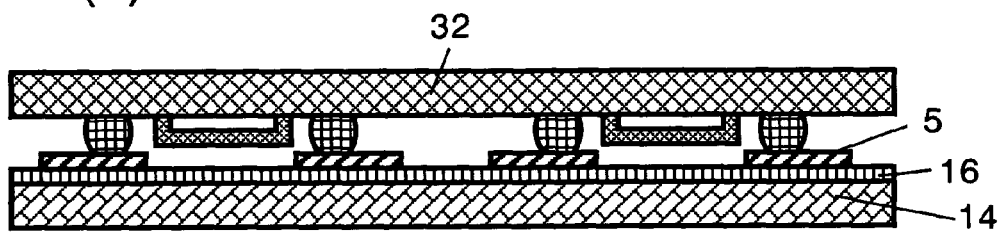

As shown in FIG. 14(b), the electrode pad 4 of surface acoustic wave element is pressed on a terminal electrode 5 formed on a carrier 14, and connected.

Figure 14C:
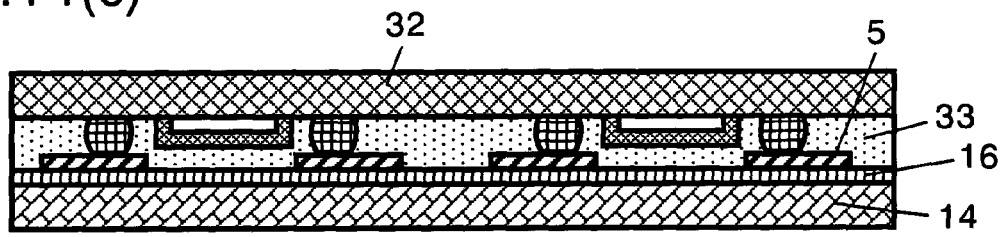

As shown in FIG. 14(c), a space between wafer 32 and carrier 14 is filled with a sealing resin 33, and cured.

Figure 14D:
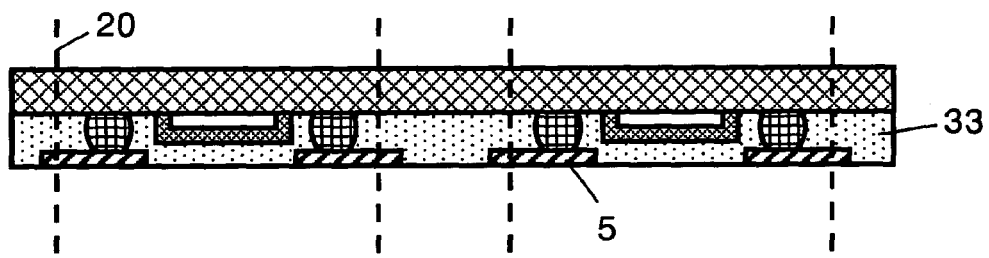
Figure 14E:
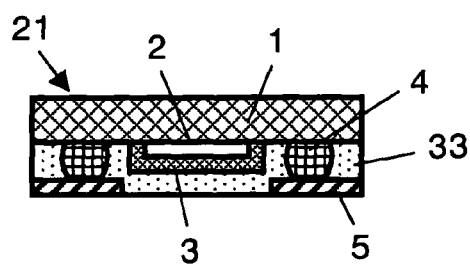

As shown in FIG. 14(d), separation layer 16 and carrier 14 are peeled off. And then, terminal electrode 5, sealing resin 33 and wafer 32 are cut along a cut line 20, to provide individual surface acoustic wave devices as shown in FIG. 14(e).

Like in the earlier example, an isolated conductor island or that which is electrically coupled with terminal electrode 5 may be formed on the main surface of carrier 14 at the same time when the terminal electrode 5 is formed. In this case, the conductor island and space formation member 3 may be attached together by means of adhesive agent or sealing resin 33. In a case where the space formation member 3 is formed of wall alone, the attaching is made with an adhesive agent applied on at least one among the top face of wall and the conductor island. In this way, the manufacturing process can be simplified like in the first example, and compact and low-profile surface acoustic wave devices are manufactured.

(Embodiment 6)

An electronic circuit device in accordance with a sixth exemplary embodiment of the present invention is described referring to the drawings.

Figure 15A:
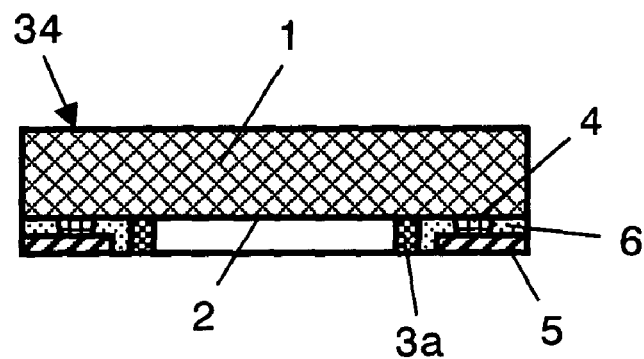
FIG. 15(a) shows a cross sectional view of a surface acoustic wave element used in an electronic circuit device in accordance with a sixth exemplary embodiment of the present invention.
Figure 15B:
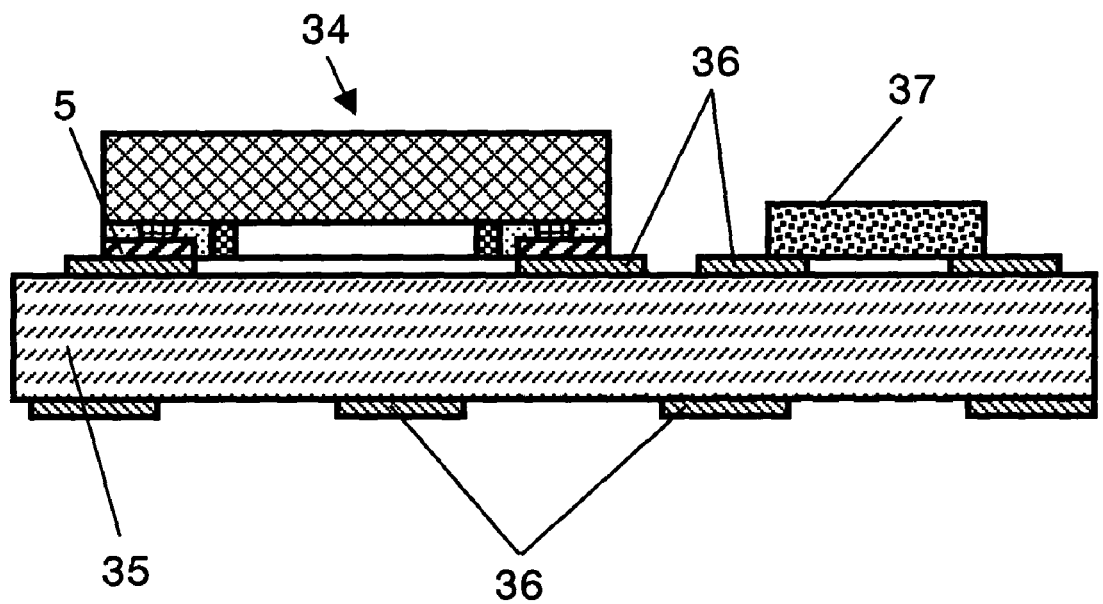
FIG. 15(b) shows a cross sectional view of the electronic circuit device.
Figure 16A:
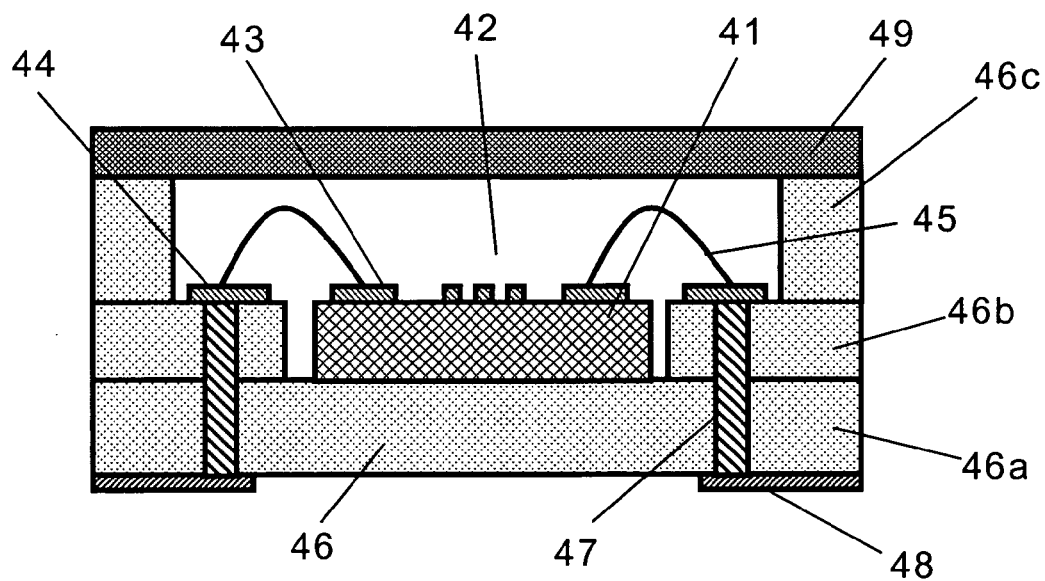
FIG. 16(a) is a cross sectional view used to describe a first example of conventional surface acoustic wave device.
Figure 16B:
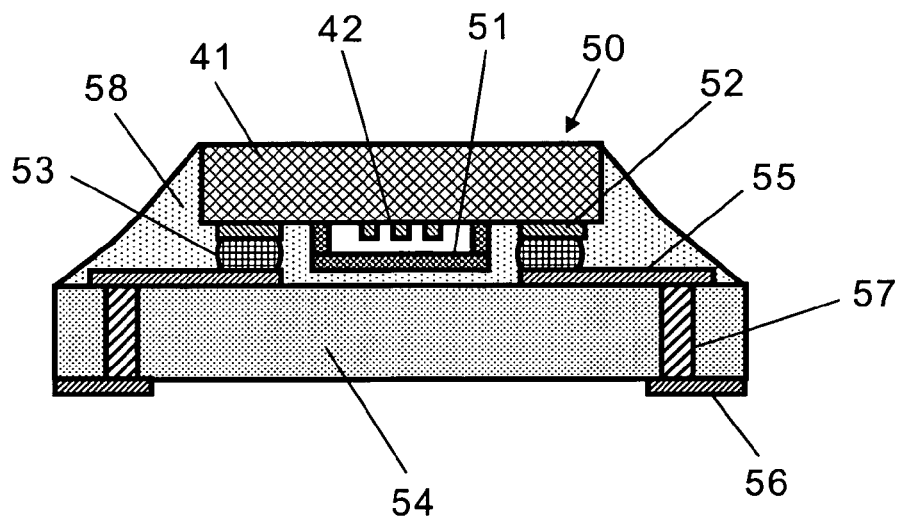
FIG. 16(b) is a cross sectional view used to describe a second example of conventional surface acoustic wave device.
Figure 17A:
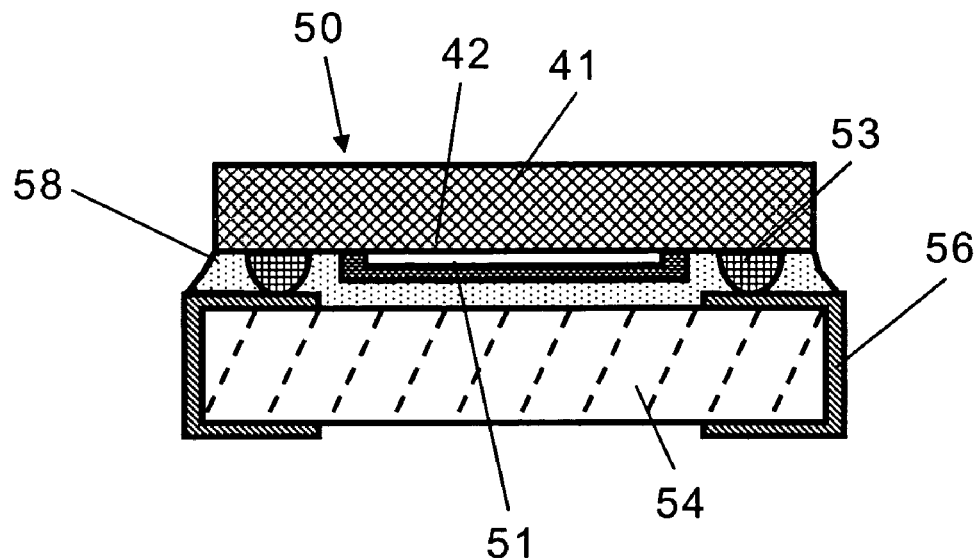
FIG. 17(a) is a cross sectional view used to describe a third example of conventional surface acoustic wave device.
Figure 17B:
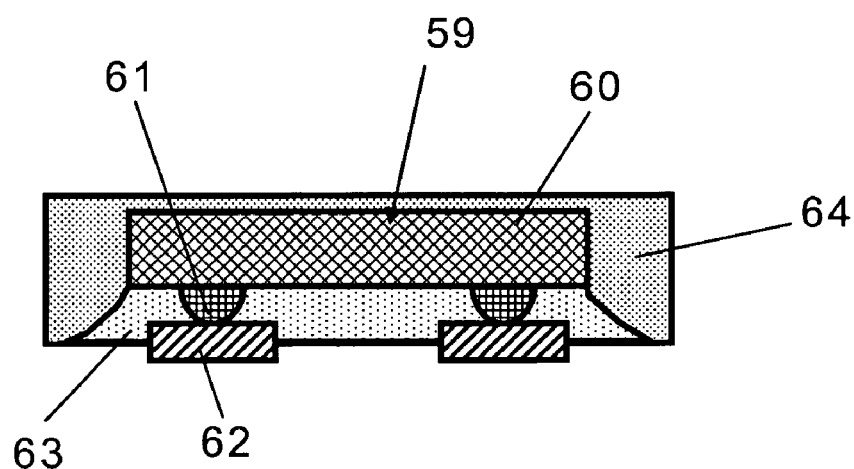
FIG. 17(b) is a cross sectional view used to describe an example of conventional semiconductor device.
Figure 18A:
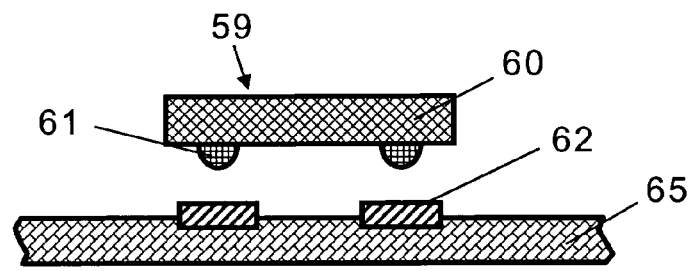
FIG. 18(a)-(e) are cross sectional views showing the process steps, used to describe an example of method for manufacturing conventional semiconductor device.
Figure 18B:
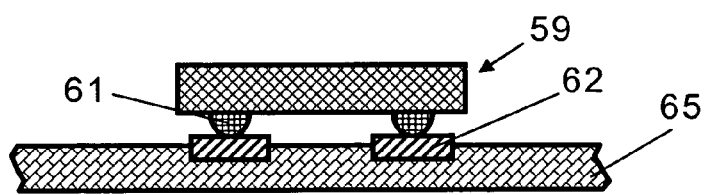
Figure 18C:
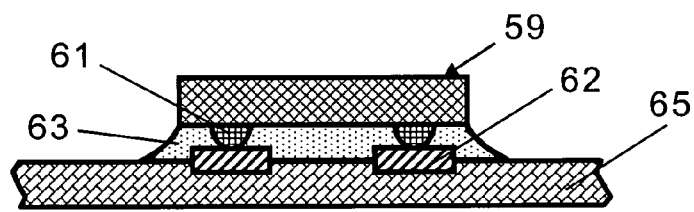
Figure 18D:
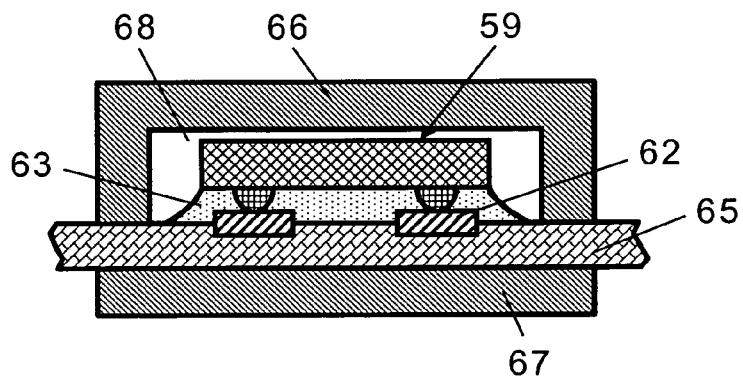
Figure 18E:
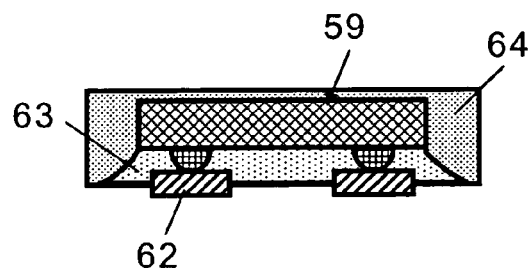

FIG. 15(a) shows a cross sectional view of a surface acoustic wave device used in an electronic circuit device in accordance with a sixth exemplary embodiment of the present invention. FIG. 15(b) is a cross sectional view of the electronic circuit device in the sixth embodiment.

As shown in FIG. 15(a), a surface acoustic wave device 34 used in embodiment 6 comprises a function region 2 provided with comb-like electrodes formed on the main surface of a piezoelectric substrate 1, an wall 3a surrounding the function region 2, a bump electrode 4 and a terminal electrode 5. Space between piezoelectric substrate 1 and terminal electrode 5 is filled with a resin 6.

FIG. 15(b) shows a state of circuit board mounted with the above-configured surface acoustic wave device.

A circuit board 35 is provided on both surfaces with wiring conductor lines (not shown) and lands 36 for components mounting. Terminal electrode 5 of the surface acoustic wave device 34 is connected with the land 36.

Circuit board 35 can be a multi-layered substrate containing circuit components formed within inside. Normally, the circuit board is mounted also with electronic component 37 on the main surface. A surface acoustic wave device 34 may be covered with resin after it is secondary-mounted. Also a surface acoustic wave device provided with a space formation member formed of an wall and a lid may be used.

Since height of the surface acoustic wave devices can be maintained at a certain determined level, the overall height of a finished electronic circuit device can be controlled with ease to be within a certain specification. Thus the electronic circuit device can be made to have a lower profile.

INDUSTRIAL APPLICABILITY

As described in the above, a surface acoustic wave device in the present invention is made with a surface acoustic wave element comprising a function region formed of comb-like electrodes, a space formation member for protecting the function region, a bump electrode and other items. The element is connected with a terminal electrode, and the key part is sealed with resin. A device thus structured occupies a small mounting area and implements a low device-profile. It can be offered at a low cost, yet provides a high reliability.

Other surface acoustic wave device in the present invention has a structure in which the bottom face of terminal electrode is exposed in the bottom surface of sealing resin, and the side face of terminal electrode is flush with the side surface of sealing resin. When secondary-mounting the above-configured device on a circuit board, solder flows fluently, as a result the solder thickness after mounting is even. The solder can also flow to the side face of a terminal electrode, therefore the soldered portion can be free from void of solder, to a high connection reliability. This advantage is further enhanced when the terminal electrode is made thicker at the outer face.

Other surface acoustic wave device in the present invention is provided with a conductor island disposed opposed to the function region. This is effective to protect the function region from a moisture intrusion, and the reliability is improved. Furthermore, when a surface acoustic wave device having the conductor island is secondary-mounted, the conductor island functions as electromagnetic shield to implement a circuit of low noise and low redundant radiation. This advantage is further enhanced by connecting the conductor island to the grounding level of the circuit.

A method for manufacturing surface acoustic wave device in the present invention uses a carrier provided with terminal electrode formed thereon, and comprises the steps of connecting a bump electrode of surface acoustic wave element with the terminal electrode, filling a space between the surface acoustic wave element and the carrier with a resin and curing the resin, and removing the carrier. In accordance with the manufacturing method, thin and small-sized surface acoustic wave devices are made available with ease.

Other method for manufacturing surface acoustic wave device in the present invention uses a carrier provided with terminal electrode formed thereon, and comprises the steps of connecting a bump electrode of surface acoustic wave element with the terminal electrode, sealing the surface acoustic wave element disposed on the carrier with resin and curing the resin, and cutting the sealing resin and the terminal electrode after removing the carrier. In accordance with the manufacturing method, it is easy to manufacture the surface acoustic wave devices whose terminal electrode at the bottom face is exposed in the bottom surface of sealing resin, while the side face of the terminal electrode is flush with the side surface of sealing resin.

Other method for manufacturing surface acoustic wave device in the present invention comprises the steps of pressing a wafer having a number of surface acoustic wave elements face to face onto a carrier having terminal electrodes and connecting these together, filling a space between the wafer and the carrier with resin and curing the resin, and cutting the wafer, resin and terminal electrode. In accordance with the manufacturing method, small and thin-profile surface acoustic wave devices can be produced efficiently at a low cost.

What is claimed is:

1. A surface acoustic wave device comprising:
   a piezoelectric substrate,
   a comb-like electrode provided on a main surface of said piezoelectric substrate,
   a space formation member provided on said comb-like electrode portion,
   a plurality of bump electrodes provided on said main surface of said piezoelectric substrate, and
   a plurality of terminal electrodes coupled to said plurality of bump electrodes, respectively
   the piezoelectric substrate and the terminal electrodes are resin-sealed to form a sealed body, wherein a main face of each of said terminal electrodes are exposed and a side face of each of the terminal electrodes is flush with one of a plurality of side surfaces of the sealed body.

2. The surface acoustic wave device of claim 1, wherein in a bottom surface of said sealed body, another main face of said terminal electrode is flush with a bottom surface of the sealed body.

3. The surface acoustic wave device of claim 1, wherein in a bottom surface of the sealed body, a resin between said terminal electrodes is protruding from another main face of said terminal electrode.

4. The surface acoustic wave device of claim 1, in a bottom surface of the sealed body, another main face of said terminal electrode is protruding from a bottom surface of the sealed body.

5. The surface acoustic wave devices of claims 2 through 4, wherein
   a thickness of said terminal electrode is thicker in an area outer than a place of connection with said bump electrodes relative to a rest of the area.

6. The surface acoustic wave device of claim 1, wherein said space formation member is formed of a wall and a lid, and disposed covering said comb-like electrode portion.

7. The surface acoustic wave device of claim 6, further comprising a conductor island disposed opposed to the lid, another main surface of said conductor island being exposed in a surface of a sealed body.

8. The surface acoustic wave device of claim 7, wherein the lid and the conductor island are glued with an adhesive agent.

9. The surface acoustic wave device of claim 7, wherein the lid and the conductor island are glued with a resin constituting the sealed body.

10. The surface acoustic wave device of claim 1, wherein said space formation member is formed of an wall and a conductor island provided making contact with said wall at a top edge to constitute a cover, and another main surface of the conductor island is exposed in a surface of a sealed body.

11. The surface acoustic wave device of claim 10, wherein the top edge of the wall is attached pressed to the conductor island.

12. The surface acoustic wave device of claim 10, wherein the top edge of the wall and the conductor island are glued with an adhesive agent applied on at least one item among the top edge of the wall and the conductor island.

13. The surface acoustic wave device of claim 7 or claim 10, wherein
    said another main surface of the conductor island is flush with said another main face of said terminal electrode.

14. The surface acoustic wave device of claim 7 or claim 10, wherein
    said another main surface of the conductor island and said another main face of said terminal electrode are flush with a surface of the sealed body.

15. The surface acoustic wave device of claim 7 or claim 10, wherein
    said terminal electrode and said another main surface of the conductor island are disposed at a position hollowed from the surface of the sealed body.

16. The surface acoustic wave device of claim 7 or claim 10, wherein
    said terminal electrode and said another main surface of the conductor island disposed protruded from the surface of the sealed body.

17. The surface acoustic wave device of claim 7 or claim 10, wherein
    a thickness of said terminal electrode is thicker in an area outer than a place of connection with said bump electrodes relative to a rest of the area.

18. The surface acoustic wave device of claim 7 or claim 10, wherein
    the conductor island is electrically connected with at least one of said terminal electrodes.

19. The surface acoustic wave device of claim 1, wherein a material of said bump electrodes contains at least one metal among the group of gold, tin, copper, lead and silver.

20. The surface acoustic wave device of claim 7 or claim 10, wherein
    said terminal electrode and the conductor island are made of a layer formed of a material containing gold as a main content, or a laminated layer formed of a material containing gold as the main content and a metal material other than gold.

21. An electronic circuit device comprising:
    a surface acoustic wave device including
       piezoelectric substrate,
       a comb-like electrode provided on a main surface of said piezoelectric substrate, a wall surrounding said comb-like electrode portion,
a plurality of bump electrodes provided on said main surface of said piezoelectric substrate, and
a plurality of terminal electrodes coupled to said plurality of bump electrodes, respectively,
wherein the piezoelectric substrate and the terminal electrodes are resin-sealed to form a sealed body,
wherein a main face of each of said terminal electrodes are exposed and a side face of each of the terminal electrodes is flush with one of a plurality of side surfaces of the sealed body; and
a circuit board provided with a wiring conductor line, wherein
said surface acoustic wave device is mounted on said circuit board and the terminal electrodes of said surface acoustic wave device are connected with said wiring conductor line.

22. The electronic circuit device of claim 21, wherein
an electronic component or a semiconductor component is mounted or contained in at least one of said circuit board and an inside of said circuit board.

23. The electronic circuit device of claim 21, wherein
at least said surface acoustic wave device is covered with a resin on said circuit board.

* * * * *

UNITED STATES PATENT AND TRADEMARK OFFICE
CERTIFICATE OF CORRECTION

PATENT NO. : 6,969,945 B2 Page 1 of 1
DATED : November 29, 2005
INVENTOR(S) : Akihiko Namba et al.

It is certified that error appears in the above-identified patent and that said Letters Patent is hereby corrected as shown below:

<u>Title page,</u>
Item [86], § 371 (c)(1), (2), (4) Date, delete "Aug. 15, 2003" and insert
-- Aug. 14, 2003 --.

Signed and Sealed this

Second Day of May, 2006

JON W. DUDAS
*Director of the United States Patent and Trademark Office*